United States Patent
Lim et al.

(10) Patent No.: US 12,293,855 B2
(45) Date of Patent: May 6, 2025

(54) TRANSPARENT CONDUCTIVE FILM, METHOD OF MANUFACTURING SAME, THIN FILM TRANSISTOR, AND DEVICE INCLUDING SAME

(71) Applicants: Samsung Electronics Co., Ltd., Suwon-si (KR); RESEARCH & BUSINESS FOUNDATION SUNGKYUNKWAN UNIVERSITY, Gyeonggi-do (KR)

(72) Inventors: Younhee Lim, Suwon-si (KR); Sangyeon Pak, Suwon-si (KR); Jiwon Son, Suwon-si (KR); Yong Wan Jin, Suwon-si (KR); SeungNam Cha, Suwon-si (KR); Kyungbae Park, Suwon-si (KR); Chuljoon Heo, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 437 days.

(21) Appl. No.: 17/898,416

(22) Filed: Aug. 29, 2022

(65) Prior Publication Data
US 2023/0079198 A1    Mar. 16, 2023

(30) Foreign Application Priority Data

Aug. 30, 2021 (KR) .......................... 10-2021-0115156

(51) Int. Cl.
*H01B 1/06* (2006.01)
*C23C 22/82* (2006.01)
(Continued)

(52) U.S. Cl.
CPC ............... *H01B 1/06* (2013.01); *C23C 22/82* (2013.01); *H01B 1/10* (2013.01); *H01L 29/45* (2013.01);
(Continued)

(58) Field of Classification Search
None
See application file for complete search history.

(56) References Cited

U.S. PATENT DOCUMENTS

| 10,916,380 B1 | 2/2021 | Obaidat et al. | |
| 2010/0038638 A1* | 2/2010 | Tao | C25D 3/56 |
| | | | 205/333 |
| 2019/0296178 A1* | 9/2019 | Bessonov | G01J 1/0209 |

FOREIGN PATENT DOCUMENTS

| CN | 105702319 A | 6/2016 |
| CN | 106601484 B | 6/2018 |

(Continued)

OTHER PUBLICATIONS

C. Cruz-Vazquez et al., "Electrical and spectroscopic properties of amorphous copper sulfide films treated with idone, lithium iodide and sodium iodide", Thin Solid Films 373, pp. 1-5, 2000.

(Continued)

*Primary Examiner* — Anthony Ho
(74) *Attorney, Agent, or Firm* — Harness, Dickey & Pierce, P.L.C.

(57) ABSTRACT

A transparent conductive film includes a metal chalcogenide compound doped with a halogen and having a sheet resistance at room temperature of less than or equal to about 60 ohm/sq.

20 Claims, 23 Drawing Sheets

(51) Int. Cl.
  *H01B 1/10* (2006.01)
  *H01L 29/45* (2006.01)
  *H10K 10/84* (2023.01)
  *H10K 30/82* (2023.01)
  *H10K 50/828* (2023.01)
  *H10K 39/32* (2023.01)
  *H10K 65/00* (2023.01)

(52) U.S. Cl.
  CPC ........... *H01L 29/458* (2013.01); *H10K 10/84* (2023.02); *H10K 30/82* (2023.02); *H10K 50/828* (2023.02); *H10K 39/32* (2023.02); *H10K 65/00* (2023.02)

(56) References Cited

FOREIGN PATENT DOCUMENTS

| | | |
|---|---|---|
| CN | 107365981 B | 10/2019 |
| CN | 110589871 A | 12/2019 |
| CN | 109979645 B | 11/2020 |
| CN | 108376712 B | 1/2021 |
| KR | 102018978 B1 | 9/2019 |

OTHER PUBLICATIONS

Journal of Power Sources, 248, 809, 2014.
Thin Solid Films 662, 90, 2018.
ACS Appl. Mater. Interfacts 13, 4244, 2013.
Motomichi Inoue et al., "Electroconducting Transparent Film of Amorphous Copper Sulfide on Polyethylene Substrate", J. Mater. Chem, 2(7), pp. 761-762, 1992.

* cited by examiner

TRANSPARENT CONDUCTIVE FILM, METHOD OF MANUFACTURING SAME, THIN FILM TRANSISTOR, AND DEVICE INCLUDING SAME

CROSS-REFERENCE TO RELATED APPLICATION

This application claims priority to and the benefit, under 35 U.S.C. § 119, of Korean Patent Application No. 10-2021-0115156 filed in the Korean Intellectual Property Office on Aug. 30, 2021, the entire contents of which are incorporated herein by reference.

BACKGROUND

1. Field

Example embodiments relate to transparent conductive films, methods of manufacturing same, and thin film transistors and devices including same.

2. Description of the Related Art

An electronic device like a flat panel display such as an LCD or LED, a touch screen panel, a solar cell, a transparent transistor, and the like may include a transparent electrode. A material for a transparent electrode has high light transmittance, for example, 70% or more in a wavelength range of 380 nm to 780 nm, and even when manufactured as a thin film, it is required to have a low sheet resistance, for example, 100 ohm/sq. or less.

The currently-used transparent electrode material may be indium tin oxide (ITO), tin oxide ($SnO_2$), zinc oxide (ZnO), and the like. The ITO is an n-type semiconductor that produces and oxygen vacancy and electrons by $SnO_2$, and electrical and optical properties of ITO are determined by vacancies in a crystalline $In_2O_3$ structure. ITO has satisfactory transmittance in a full visible light range and shows sheet resistance of greater than or equal to 100 ohm/sq. when deposited at room temperature. In addition, ITO has insufficient flexibility and is expensive due to limited indium reserves, and thus there is a need for a material substituting for ITO. Therefore, development of a flexible transparent electrode material having low sheet resistance as well as high transmittance is needed.

SUMMARY

Some example embodiments provide a transparent conductive film having high conductivity, excellent transparency, excellent light transmittance, excellent mechanical properties, and low sheet resistance.

Some example embodiments provide a method of manufacturing a transparent conductive film in a low-cost and simple process at a low temperature.

Some example embodiments provide a thin film transistor including the transparent conductive film.

Some example embodiments provide a device including the transparent conductive film.

According to some example embodiments, a transparent conductive film includes a metal chalcogenide compound doped with a halogen, and has a sheet resistance at room temperature (e.g., a temperature of about 20° C. to about 25° C.) of less than or equal to about 60 ohm/sq.

The metal chalcogenide compound may be represented by Chemical Formula 1.

$$M_xX_y \quad \text{[Chemical Formula 1]}$$

In Chemical Formula 1, M is a transition metal, an alkali metal, an alkaline earth metal, or any combination thereof, X is S, Se, Te, or any combination thereof, and x and y have respective values corresponding to a stoichiometric ratio of M and X.

In Chemical Formula 1, M may be Cu, Fe, Zn, Co, Mo, W, Li, or any combination thereof.

The halogen may be fluorine, chlorine, bromine, iodine, or any combination thereof. A content of the halogen in the transparent conductive film may be in a range of about 0.30 atomic % to about 0.70 atomic % based on a total number of atoms of the transparent conductive film.

The transparent conductive film may be configured to exhibit a light transmittance of incident light of greater than or equal to about 80% in a wavelength region of about 550 nm or more.

The transparent conductive film may be configured to exhibit a sheet resistance increase rate of less than or equal to about 20% after 10000 repetitions of bending with a radius of curvature of 4 mm or less.

A carrier density of the transparent conductive film may be greater than or equal to about $1.0 \times 10^{21}$ cm$^{-3}$.

A work function of the metal chalcogenide compound doped with the halogen of the transparent conductive film may be greater than or equal to about 5.2 eV.

The transparent conductive film may not include an organic material.

According to some example embodiments, a transparent conductive film may include a metal chalcogenide compound doped with a halogen, wherein the metal chalcogenide compound is represented by Chemical Formula 1:

$$M_xX_y \quad \text{[Chemical Formula 1]}$$

wherein, in Chemical Formula 1, M is a transition metal, an alkali metal, an alkaline earth metal, or any combination thereof, X is S, Se, Te, or any combination thereof, and x and y have respective values corresponding to a stoichiometric ratio of M and X, and wherein a content of the halogen in the transparent conductive film is in a range of about 0.30 atomic % to about 0.70 atomic % based on a total number of atoms of the transparent conductive film.

The halogen may be fluorine, chlorine, bromine, iodine, or any combination thereof.

In Chemical Formula 1, M may be Cu, Fe, Zn, Co, Mo, W, Li, or any combination thereof, x may be in a range of 1 to 2, and y may be in a range of 1 to 3.

The metal chalcogenide compound may be at least one of CuS, $Cu_2S$, CuSe, $Cu_2Se$, $Cu_2Se$, $CuS_{1-z}Se_z$(0<z<1), CuTe, $Cu_2Te$, FeS, $FeS_2$, $Fe_2S$, FeSe, $FeSe_2$, $Fe_2Se$, $FeS_{1-z}Se_z$ (0<z<1), FeTe, $FeTe_2$, $Fe_2Te$, ZnS, $Zn_2S$, ZnSe, $Zn_2Se$, $ZnS_{1-z}Se_z$ (0<z<1), ZnTe, or $Zn_2Te$.

The transparent conductive film may have a thickness of about 2 nm to about 40 nm.

According to some example embodiments, a method of manufacturing a transparent conductive film includes exposing a metal film to a chalcogen element-containing material to prepare a film including a metal chalcogenide compound; and exposing the film including the metal chalcogenide compound to a halogen element-containing material to produce a transparent conductive film including a metal chalcogenide compound doped with a halogen.

The exposing the metal film to the chalcogen element-containing material may expose the metal film to the chalcogen element-containing material for about 10 seconds to about 50 seconds.

The exposing the film including the metal chalcogenide compound to the halogen element-containing material may expose the film including the metal chalcogenide compound to the halogen element-containing material for about 10 seconds to about 50 seconds.

The method may further include heat-treating the transparent conductive film including the metal chalcogenide compound doped with the halogen.

The heat-treating may be performed at about 250° C. or less.

According to some example embodiments, a thin film transistor including the transparent conductive film is provided.

The thin film transistor may include a semiconductor thin film, a gate electrode at least partially overlapped with the semiconductor thin film, and a source electrode and a drain electrode electrically connected to the semiconductor thin film, wherein the source electrode and the drain electrode include the transparent conductive film.

The source electrode and the drain electrode include a first metal chalcogenide compound, the semiconductor thin film includes a second metal chalcogenide compound, and the first metal chalcogenide compound and the second metal chalcogenide compound are doped with a halogen.

According to some example embodiments, a device includes the aforementioned transparent conductive film or thin film transistor.

The aforementioned transparent conductive film has high conductivity, excellent transparency, mechanical properties, and low sheet resistance, and thus can be used as a transparent electrode of a device. In addition, since the aforementioned transparent conductive film can be manufactured by a simple room temperature process, it can be formed on a flexible substrate and thus can be usefully used for a flexible device.

DETAILED DESCRIPTION

Figure 1:
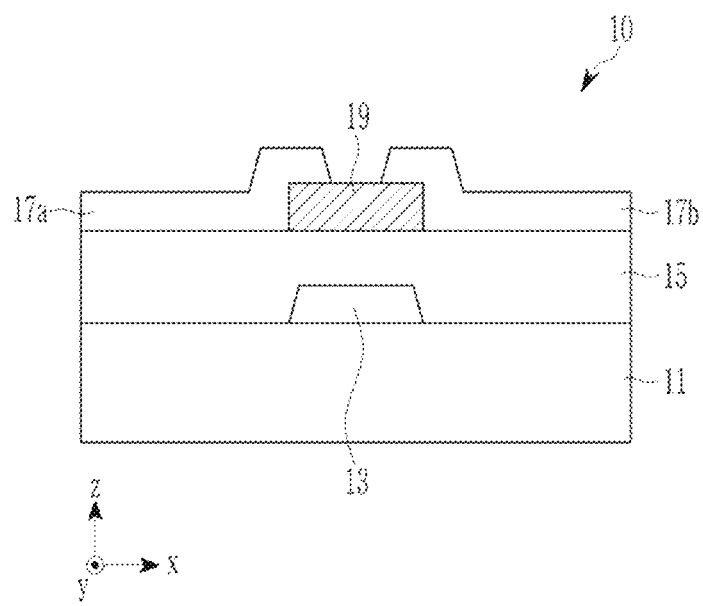
FIG. 1 is a cross-sectional view showing a thin film transistor according to some example embodiments.

The inventive concepts will be described more fully hereinafter in the following detailed description, in which some but not all example embodiments of the inventive concepts are described. The inventive concepts may be embodied in many different forms and is not be construed as limited to some example embodiments set forth herein, rather, these embodiments are provided so that the following detailed description will fully convey the scope of the inventive concepts to those skilled in the art.

Thus, in some example embodiments, well-known technologies are not specifically explained to avoid ambiguous understanding of the present inventive concepts. Unless otherwise defined, all terms used in the specification (including technical and scientific terms) may be used with meanings commonly understood by a person having ordinary knowledge in the art.

Further, unless explicitly defined to the contrary, the terms defined in a generally-used dictionary are not ideally or excessively interpreted.

In addition, unless explicitly described to the contrary, the word "comprise" and variations such as "comprises" or "comprising" will be understood to imply the inclusion of stated elements but not the exclusion of any other elements.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, "room temperature" means a temperature of about 20° C. to about 25° C., and "normal pressure" means a pressure of about 1 atm.

As used herein, "combination" includes a mixture, an alloy, or a laminated structure of two or more.

Further, the singular includes the plural unless mentioned otherwise.

It will further be understood that when an element is referred to as being "on" another element, it may be above or beneath or adjacent (e.g., horizontally adjacent) to the other element. It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof. Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%). Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%). Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%). It will be understood that elements and/or properties thereof may be recited herein as being "identical" to, "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%). It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof. When the terms "about" or "substantially" are used in this specification in connection with a numerical value, it is intended that the associated numerical value include a tolerance of ±10% around the stated numerical value. Moreover, when the words "about" and "substantially" are used in connection with geometric shapes, it is intended that precision of the geometric shape is not required but that latitude for the shape is within the scope of the inventive concepts. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As used herein, when a definition is not otherwise provided, a work function or energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level. In addition, a difference between the work function and/or the energy level may be a value obtained by subtracting a small value of the absolute value from a large value of the absolute value.

As used herein, when a definition is not otherwise provided, the HOMO energy level may be evaluated by the amount of photoelectrons emitted according to energy by irradiating UV light onto a thin film using AC-2 (Hitachi) or AC-3 (Riken Keiki Co., LTD.).

As used herein, when a definition is not otherwise provided, the LUMO energy level is obtained as follow: an energy bandgap is obtained using a UV-Vis spectrometer (Shimadzu Corporation), and then the LUMO energy level is calculated from the energy bandgap and the measured HOMO energy level.

As used herein, "at least one of A, B, or C," "one of A, B, C, or a combination thereof" and "one of A, B, C, and a combination thereof" refer to each constituent element, and a combination thereof (e.g., A; B; C; A and B; A and C; B and C; or A, B and C).

Hereinafter, a transparent conductive film according to some example embodiments is described.

The transparent conductive film according to some example embodiments includes a metal chalcogenide compound doped with a halogen, and has a sheet resistance at room temperature (e.g., a temperature of about 20° C. to about 25° C.) of less than or equal to about 60 ohm/sq.

The metal chalcogenide compound may be represented by Chemical Formula 1.

$$M_xX_y \qquad \text{[Chemical Formula 1]}$$

In Chemical Formula 1, M is a transition metal, an alkali metal, an alkaline earth metal, or any combination thereof, X is S, Se, Te, or any combination thereof, and x and y are determined by (e.g., have respective values corresponding to) a stoichiometric ratio of M and X. For example, x may be in the range of 1 to 2 (e.g., inclusively between 1 and 2) and y may be in the range of 1 to 3 (e.g., inclusively between 1 and 3). Specifically, when M is Cu, x may be in the range of 1 to 2, y may be 1, and when M is Fe, Zn, or Co, x may be in the range of 1 to 2 and y may be in the range of 1 to 3, when M is Mo or W, x may be 1 and y is 2, and when M is Li, x and y may be 1.

The transition metal means an element in which electrons exist in d-orbital and may mean an element of Groups 3 to 12 of the periodic table.

In Chemical Formula 1, M may be Cu, Fe, Zn, Co, Mo, W, Li, or any combination thereof.

Specific examples of the metal chalcogenide compound may include CuS, $Cu_2S$, CuSe, $Cu_2Se$, $Cu_2Se$, $CuS_{1-z}Se_z$ (0<z<1), CuTe, $Cu_2Te$, FeS, $FeS_2$, $Fe_2S$, FeSe, $FeSe_2$, $Fe_2Se$, $FeS_{1-z}Se_z$(0<z<1), FeTe, $FeTe_2$, $Fe_2Te$, ZnS, $Zn_2S$, ZnSe, $Zn_2Se$, $ZnS_{1-z}Se_z$(0<z<1), ZnTe, $Zn_2Te$, and the like.

The halogen may be selected from fluorine, chlorine, bromine, iodine, or any combination thereof. A content of the halogen (e.g., a content of the halogen in the transparent conductive film) may be greater than or equal to about 0.30 atomic %, for example greater than or equal to about 0.35 atomic %, or greater than or equal to about 0.40 atomic % and less than or equal to about 0.70 atomic %, for example less than or equal to about 0.65 atomic %, or less than or equal to about 0.60 atomic %, based on the total number of atoms of the transparent conductive film. For example, content of the halogen (e.g., a content of the halogen in the transparent conductive film) may be in a range of about 0.30 atomic % to about 0.70 atomic % based on a total number of atoms of the transparent conductive film.

In addition, a thickness of the transparent conductive film may be greater than or equal to about 2 nm, for example greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm, and less than or equal to about 40 nm, for example less than or equal to about 39 nm, less than or equal to about 38 nm, less than or equal to about 37 nm, less than or equal to about 36 nm, or less than or equal to about 35 nm. For example, a thickness of the transparent conductive film may be about 2 nm to about 40 nm.

The transparent conductive film has a sheet resistance measured at room temperature (e.g., a temperature of about 20° C. to about 25° C.) of less than or equal to about 60 ohm/sq., it may be used as a transparent electrode of a flexibility device. In some example embodiments, the sheet resistance of the transparent conductive film at room temperature may be greater than or equal to 0.00 ohm/sq., and less than or equal to about 60 ohm/sq. In some example embodiments, the sheet resistance of the transparent conductive film at room temperature may be greater than or equal to about 0.01 ohm/sq., and less than or equal to about 60 ohm/sq. In some example embodiments, the sheet resistance of the transparent conductive film at room temperature may be greater than or equal to about 0.01 ohm/sq., and less than or equal to about 55 ohm/sq., for example less than or equal to about 50 ohm/sq., less than or equal to about 45 ohm/sq., less than or equal to about 40 ohm/sq., less than or equal to about 35 ohm/sq., less than or equal to about 30 ohm/sq., less than or equal to about 25 ohm/sq., less than or equal to about 20 ohm/sq., less than or equal to about 15 ohm/sq., less than or equal to about 14 ohm/sq., less than or equal to about 13 ohm/sq., less than or equal to about 12 ohm/sq., less than or equal to about 11 ohm/sq., or less than or equal to about 10 ohm/sq.

The transparent conductive film may have (e.g., may be configured to exhibit, have, etc.) a light transmittance (e.g., a light transmittance of incident light) of greater than or equal to about 80%, for example greater than or equal to about 82%, greater than or equal to about 84%, greater than or equal to about 85%, greater than or equal to about 86%, greater than or equal to about 88%, or greater than or equal to about 90% in a wavelength region of 550 nm or more (e.g., a wavelength region of about 550 nm to about 3000 nm of the incident light). The transparent conductive film may have a light transmittance (e.g., a light transmittance of incident light) of less than or equal to 100% in a wavelength region of 550 nm or more (e.g., a wavelength region of 550 nm or more of the incident light). The transparent conductive film may have a light transmittance (e.g., a light transmittance of incident light) of less than or equal to about 99.9% in a wavelength region of 550 nm or more (e.g., a wavelength region of 550 nm or more of the incident light). For example, the transparent conductive film may have (e.g., may be configured to exhibit, have, etc.) a light transmittance (e.g., a light transmittance of incident light) of greater than or equal to about 80% and less than or equal to about 99.9% in a wavelength region of 550 nm or more (e.g., a wavelength region of the incident light of about 550 nm to about 3000 nm). Since the transparent conductive film has such a high light transmittance, the transparent conductive film may be used as a transparent electrode of a device.

In addition, the transparent conductive film may have (e.g., may be configured to exhibit, have, etc.) a sheet resistance increase rate of less than or equal to about 20%, for example less than or equal to about 19%, less than or equal to about 18%, less than or equal to about 17%, less than or equal to about 16%, or less than or equal to about 15%, and greater than or equal to about 0.01% after 10000 repetitions of bending with a radius of curvature of 4 mm or less (e.g., a radius of curvature that is inclusively between 0.01 mm and 4 mm). The transparent conductive film may have (e.g., may be configured to exhibit, have, etc.) a sheet resistance increase rate of less than or equal to about 20% and greater than or equal to 0.00% after 10000 repetitions of bending with a radius of curvature of 4 mm or less e.g., a radius of curvature that is inclusively between 0.01 mm and 4 mm). The sheet resistance increase rate can be calculated by Equation 1 when the initial sheet resistance is $R_0$ and the sheet resistance is $R_f$ after 10000 repetitions of bending (e.g., after 10000 repetitions of bending with a radius of curvature that is inclusively between 0.01 mm and 4 mm).

$$[(R_f-R_0)/R_0]*100 \quad \text{[Equation 1]}$$

As described above, the low sheet resistance increase rate after repetitions of bending indicates excellent mechanical stability and reliability.

A carrier density of the transparent conductive film may be greater than or equal to about $1.0\times10^{21}$ cm$^{-3}$, for example, greater than or equal to about $1.5\times10^{21}$ cm$^{-3}$. In addition, the carrier density of the transparent conductive film may be less than or equal to about $5.0\times10^{21}$ cm$^{-3}$, for example, less than or equal to about $4.9\times10^{21}$ cm$^{-3}$. Improved conductivity may be provided within the above range. For example, a carrier density of the transparent conductive film may be greater than or equal to about $1.0\times10^{21}$ cm$^{-3}$ and may be less than or equal to about $5.0\times10^{21}$ cm$^{-3}$. For example, a carrier density of the transparent conductive film may be greater than or equal to about $1.5\times10^{21}$ cm$^{-3}$ and may be less than or equal to about $4.9\times10^{21}$ cm$^{-3}$.

A work function of the metal chalcogenide compound doped with the halogen of the transparent conductive film may be greater than or equal to about 5.2 eV, for example, greater than or equal to about 5.3 eV, or greater than or equal to about 5.4 eV, or greater than or equal to about 5.6 eV. The work function of the metal chalcogenide compound doped with the halogen of the transparent conductive film may be less than or equal to about 20.0 eV, for example less than or equal to about 20.0 eV. Since the work function is within the above range, it may be used as an electrode replacing the conventional ITO electrode.

The transparent conductive film may not contain organic materials derived from various organic solvents or ligands since the film is manufactured by a dry process. For example, the transparent conductive film may not contain any organic materials, for example any carbon-containing materials. Not including any organic material may mean including in an amount of about 100 ppm or less, for example including in an amount of 0 ppm to about 100 ppm, an amount of about 0.01 ppm to about 100 ppm, an amount of about 0.10 ppm to about 100 ppm, an amount of about 1 ppm to about 100 ppm, an amount of about 10 ppm to 100 ppm, or the like (based on weight). In some example embodiments, a transparent conductive film that does not contain any organic materials may be understood to contain substantially no organic material, or if present, to contain organic material that is present in the transparent conductive film in an amount below the detection limit of a given detection means or at an impurity level. Examples of the detection means include a gas chromatography-mass spectrometer (GC-MS), a thermal desorption spectrometer, and the like.

Since a transition metal oxide conventionally used as a transparent conductive film has low mechanical strength and a high process temperature, a transition metal chalcogenide compound has been proposed as an alternative. Since this transition metal chalcogenide compound has excellent mechanical properties and transparency but uses a deposition process requiring high vacuum and temperature during the formation into a film, there is a limit to directly forming the film on a flexible substrate. Accordingly, some example embodiments of the present inventive concepts are to provide a method of manufacturing the transparent conductive film formable on the flexible substrate.

Hereinafter, a method of manufacturing the transparent conductive film according to some example embodiments is described. The method of manufacturing the transparent conductive film includes exposing a metal film to a chalcogen element-containing material to prepare a film including a metal chalcogenide compound; and exposing the film including the metal chalcogenide compound to a halogen element-containing material to produce a transparent conductive film including a metal chalcogenide compound doped with a halogen.

The metal film is a film having a nanosized thickness and prepared by depositing a metal selected from a transition metal, an alkali metal, an alkaline-earth metal, and any combination thereof or a commercially available metal film. The deposition process of the metal may be performed under a pressure of about $1.0\times10^{-6}$ to about $4.0\times10^{-6}$ torr at room temperature. The deposition process of the metal may include a physical vapor deposition (PVD) such as sputtering, a chemical vapor deposition (CVD), an atomic layer deposition, or any combination thereof.

The halogen element-containing material may include a chalcogen element of S, Se, Te, or any combination thereof. The halogen element-containing material may include $H_2S$, $H_2Se$, $H_2Te$, or any combination thereof.

The exposing the metal film to the chalcogen element-containing material may expose the metal film to the halogen element-containing material for about 10 seconds or more, for example about 20 seconds or more and about 50 seconds or less, for example, about 40 seconds or less, for example about 10 seconds to about 50 seconds. Within the ranges, the metal may be sufficiently reacted with the chalcogen element.

A metal chalcogenide compound obtained by exposing the metal film to the halogen element-containing material may be formed, for example, into a 2-dimensional nano structure such as a nano particle and the like.

The metal chalcogenide compound is exposed to a halogen element-containing material to dope the metal chalcogenide compound with a halogen.

The halogen element-containing material may be a halogen molecule or a halogen-containing compound in a gaseous, liquid, or solid state. Examples of the halogen molecule may be $F_2$, $Cl_2$, $Br_2$, $I_2$, or the like, and examples of the halogen-containing compound may be HF, HCl, HI, or the like.

The exposing the film including the metal chalcogenide compound to the halogen element-containing material may expose the film including the metal chalcogenide compound to the halogen element-containing material for about 10 seconds or more, for example, about 20 seconds or more and about 50 seconds or less, for example, about 40 seconds or less, for example about 10 seconds to about 50 seconds. Within the ranges, the halogen element in a desired amount may be doped on the metal chalcogenide compound.

The manufacturing method may further include a process of heat-treating the transparent conductive film including the metal chalcogenide compound doped with the halogen.

The heat treatment may be performed at a temperature of about 250° C. or less, for example, about 200° C. or less, about 150° C. less, or about 100° C. or less. The heat treatment may be performed at about 80° C. or higher, for example, about 85° C. or higher, about 90° C. or higher, about 95° C. or higher, or about 100° C. or higher. The heat treatment may be performed at a temperature of, for example, about 80° C. to about 250° C. As described above, since the heat treatment is performed at a low temperature, the transparent conductive film may be formed on the flexible substrate without damage to the flexible substrate.

The transparent conductive film has high conductivity, excellent transparency, light transmittance, and mechanical properties, and low sheet resistance and thus may be applied as an electrode (a source electrode, a drain electrode, or a gate electrode) of a thin film transistor and a light-transmitting electrode of various devices.

Hereinafter, a thin film transistor including the transparent conductive film according to some example embodiments is provided with reference to FIG. 1.

FIG. 1 is a cross-sectional view illustrating a thin film transistor according to some example embodiments.

Referring to FIG. 1, the thin film transistor 10 includes a gate electrode 13 on a substrate 11, a gate insulation layer 15 on the gate electrode 13, a semiconductor thin layer 19 (also referred to interchangeably as a semiconductor thin film) overlapped with the gate electrode 13 (e.g., overlapped in a vertical direction extending perpendicular to an upper surface of the substrate 11, for example in the z-axis direction), and a source electrode 17a and a drain electrode 17b electrically connected to the semiconductor thin layer 19.

The substrate 11 may be made of (e.g., may comprise) transparent glass, silicon, plastic, or the like. The gate electrode 13 formed on the substrate 11 is connected to a gate line (not shown) that transmits (e.g., is configured to transmit) a gate signal. The gate electrode 13 may include gold (Au), copper (Cu), nickel (Ni), aluminum (Al), molybdenum (Mo), chromium (Cr), tantalum (Ta), titanium (Ti), an alloy thereof, or any combination thereof. The gate electrode 13 may include the aforementioned transparent conductive film.

The gate insulation layer 15 is formed on the gate electrode 13. The gate insulation layer 15 may be made of an organic material, an inorganic material, and/or an organic-inorganic material, and may be made of, for example, an oxide, a nitride, or an oxide. Examples of the organic material may include a soluble polymer compound such as a polyvinyl alcohol-based compound, a polyimide-based compound, a polyacryl-based compound, a polystyrene-based compound, benzocyclobutane (BCB), etc., and examples of the inorganic material may include silicon nitride ($SiN_x$), silicon oxide ($SiO_2$), etc.

The semiconductor thin layer 19 is formed on the gate insulation layer 15. The semiconductor thin layer 19 may include an organic semiconductor (e.g., poly(3,4-ethylene-dioxythiophene) (PEDOT)), an inorganic semiconductor (e.g., silicon), or an organic-inorganic semiconductor.

The source electrode 17a and the drain electrode 17b are formed on the semiconductor thin layer 19. The source electrode 17a and the drain electrode 17b face each other on the semiconductor thin layer 19. The source electrode 17a is connected to a data line (not shown) that transmits a data signal. The source electrode 17a and the drain electrode 17b may include the aforementioned transparent conductive film.

In some example embodiments, the source electrode 17a and the drain electrode 17b may include a first metal chalcogenide compound and the semiconductor thin layer 19 may include a second metal chalcogenide compound, and the first metal chalcogenide compound and the second metal chalcogenide compound may be doped with a halogen. The thin film transistor of this structure may be formed by stacking a semiconductor thin layer 19 containing a second metal chalcogenide compound and a source electrode 17a and a drain electrode 17b containing a first metal chalcogenide compound and then doping with a halogen at the same time, and thereby the manufacturing process of the transparent conductive film and the thin film transistor manufacturing process may be simultaneously performed to simplify the process and improve a contact resistance between the semiconductor thin film and the transparent conductive film. The first metal chalcogenide compound may be a compound represented by Chemical Formula 1, as described in the transparent conductive film. As the second metal chalcogenide compound, any inorganic semiconductor capable of halogen doping may be used without limitation. The second metal chalcogenide compound may be, for example, represented by Chemical Formula 2.

$$M'X'_2 \qquad \text{[Chemical Formula 2]}$$

In Chemical Formula 2, M' is a transition metal, and X' is S, Se, Te, or combinations thereof. The transition metal may be, for example, a Group 4, Group 5, or Group 6 element. Specific examples of the second metal chalcogenide compound may include $MoS_2$, $MoSe_2$, $MoTe_2$, $WS_2$, $Wse_2$, $Wte_2$, $Cu_2S$, $Cu_2Se$, $Cu_2Te$, and the like.

Here, a thin film transistor having a bottom gate and a top contact structure has been described as an example of the thin film transistor, but the present inventive concepts are not limited thereto, and may be applied to (e.g., included in) thin film transistors of all structures such as a thin film transistor having a top gate and/or bottom contact structure.

The transparent conductive film or thin film transistor may be applied to various electronic devices, and the electronic devices may include, for example, a liquid crystal display device, a light emitting display device, an electrophoretic display device, a photoelectric device, a sensor, a touch panel, a solar cell, an e-window, or a heat mirror, but are not limited thereto.

A sensor to which a double transparent conductive film is applied will be described. The sensor may be a light absorption sensor capable of receiving light and converting it into an electrical signal.

Figure 2:
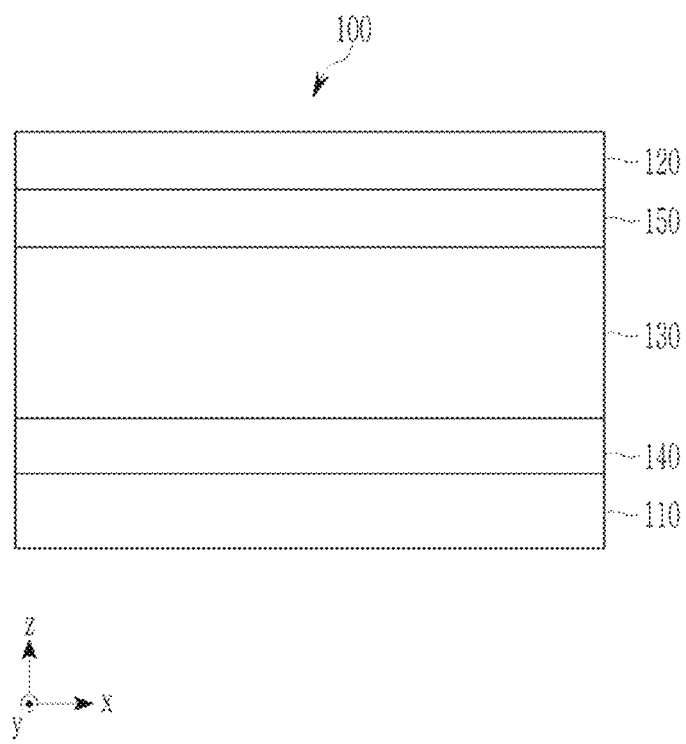
FIG. 2 is a cross-sectional view showing an example of a sensor according to some example embodiments.

FIG. 2 is a cross-sectional view showing an example of a sensor according to some example embodiments.

Referring to FIG. 2, the sensor 100 according to some example embodiments includes a first electrode 110, a second electrode 120, a photoelectric conversion layer 130, and auxiliary layers 140 and 150.

A substrate (not shown) may be disposed under the first electrode 110 or on the second electrode 120. The substrate may be, for example, an inorganic substrate such as a glass plate or a silicon wafer or an organic substrate made of (e.g., comprising) an organic material such as polycarbonate, polymethyl methacrylate, polyethylene terephthalate, polyethylene naphthalate, polyamide, polyethersulfone, or any combination thereof. The substrate may be omitted.

The substrate may be, for example, a semiconductor substrate, or a silicon substrate. The semiconductor substrate may include a circuit unit (not shown), and the circuit unit may include transmission transistors (not shown) and/or charge storage (not shown) integrated in the semiconductor substrate. The circuit unit may be electrically connected to the first electrode 110 or the second electrode 120. The transmission transistor may be the transistor shown in FIG. 1.

One of the first electrode 110 or the second electrode 120 may be an anode and the other may be a cathode. For example, the first electrode 110 may be an anode and the second electrode 120 may be a cathode. For example, the first electrode 110 may be a cathode and the second electrode 120 may be an anode.

At least one of the first electrode 110 or the second electrode 120 may be a light-transmitting electrode including the aforementioned transparent conductive film. The light-transmitting electrode may be a light-receiving electrode disposed on the light-receiving side.

Any one of the first electrode 110 or the second electrode 120 may be a transflective electrode or a reflective electrode. The transflective electrode may have a light transmittance (e.g., of incident light) of greater than or equal to about 30% and less than about 85%, about 40% to about 80%, or about 40% to about 75%. The transflective electrode may include, for example, at least one of a carbon conductor or a metal thin film. The carbon conductor may include one or more of graphene or carbon nanostructures and the metal thin film may be a very thin film including aluminum (Al), magnesium (Mg), silver (Ag), gold (Au), magnesium-silver (Mg—Ag), magnesium-aluminum (Mg-Al), an alloy thereof, or any combination thereof. The reflective electrode may include a reflective layer having a light transmittance of less than or equal to about 5% and/or a reflectance of greater than or equal to about 80%, and the reflective layer may include an optically opaque material. The optically opaque material may include a metal, a metal nitride, or any combination thereof, for example silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto. The reflective electrode may be formed of a reflective layer or may have a stacked structure of a reflective layer/transmissive layer or a transmissive layer/reflective layer/transmissive layer, and the reflective layer may be one layer or two or more layers.

The photoelectric conversion layer 130 may be configured to absorb light of at least some wavelength spectrum and convert the absorbed light into an electrical signal. For example, the photoelectric conversion layer 130 may be configured to convert at least a portion of light in the blue wavelength region (hereinafter referred to as "blue light"), light in the green wavelength region (hereinafter referred to as "green light"), light in the red wavelength region (hereinafter referred to as "red light"), or light in the infrared wavelength region (hereinafter referred to as "infrared light") into an electrical signal.

For example, the photoelectric conversion layer 130 may be configured to selectively absorb any one of blue light, green light, red light, or infrared light and convert the absorbed light into an electrical signal. Herein, the selective absorption of one of blue light, green light, red light, and infrared light may mean that a peak absorption wavelength (λmax) of an absorption spectrum is present in one of wavelength regions of greater than or equal to about 380 nm and less than about 500 nm, about 500 nm to about 600 nm, greater than about 600 nm and less than about 700 nm, and greater than about 700 nm to less than about 3000 nm, and that the absorption spectrum in the corresponding wavelength region is significantly higher than that of other wavelength regions. Herein, the "significantly higher" may mean that about 70% to about 100%, about 75% to about 100%, about 80% to about 100%, about 85% to about 100%, about 90% to about 100%, or about 95% to about 100% of the total area of the absorption spectrum may belong to the corresponding wavelength region.

The photoelectric conversion layer 130 may include at least one p-type semiconductor and at least one n-type semiconductor for photoelectric conversion of the absorbed light. The p-type semiconductor and the n-type semiconductor may form a pn junction, generate excitons by receiving light from the outside, and then separate the generated excitons into holes and electrons.

At least one of the p-type semiconductor or the n-type semiconductor may be a light absorbing material, and for example, each of the p-type semiconductor and the n-type semiconductor may be a light absorbing material. For example, at least one of the p-type semiconductor or the n-type semiconductor may be an organic material. For example, at least one of the p-type semiconductor or the n-type semiconductor may be a wavelength-selective light absorbing material configured to selectively absorb light in a particular (or, alternatively, predetermined) wavelength spectrum. For example, the p-type semiconductor and the n-type semiconductor may have the maximum absorption wavelength (λmax) in the same or different wavelength region.

For example, at least one of the p-type semiconductor or the n-type semiconductor may be a light absorbing material having a maximum absorption wavelength ($\lambda_{max}$) in a wavelength region of greater than or equal to about 380 nm and less than about 500 nm and may be, for example, an organic light absorbing material having a maximum absorption wavelength ($\lambda_{max}$) in a wavelength region of about 410 nm to about 480 nm.

For example, at least one of the p-type semiconductor or the n-type semiconductor may be a light absorbing material having a maximum absorption wavelength ($\lambda_{max}$) in a wavelength region of about 500 nm to about 600 nm and may be, for example, an organic light absorbing material having a maximum absorption wavelength ($\lambda_{max}$) in a wavelength region of about 520 nm to about 580 nm.

For example, at least one of the p-type semiconductor or the n-type semiconductor may be a light absorbing material having a maximum absorption wavelength ($\lambda_{max}$) in a wavelength region of greater than about 600 nm and less than about 700 nm and may be, for example, an organic light absorbing material having a maximum absorption wavelength ($\lambda_{max}$) in a wavelength region of about 620 nm to about 680 nm.

For example, the HOMO energy level of the p-type semiconductor may be about 5.0 eV to about 6.0 eV, and within the above range, about 5.1 eV to about 5.9 eV, about 5.2 eV to about 5.8 eV, or about 5.3 eV to about 5.8 eV. For example, the LUMO energy level of the p-type semiconductor may be about 2.7 eV to about 4.3 eV, and within the above range, about 2.8 eV to about 4.1 eV or about 3.0 eV to about 4.0 eV. For example, the energy bandgap of the p-type semiconductor may be about 1.7 eV to about 2.3 eV, and within the above range, about 1.8 eV to about 2.2 eV or about 1.9 eV to about 2.1 eV.

For example, a p-type semiconductor may be an organic material having a core structure including an electron donating moiety EDM, a π-conjugated linking moiety LM, and an electron accepting moiety EAM.

EDM-LM-EAM        [Chemical Formula 3]

In Chemical Formula 3,

EDM may be an electron donating moiety,

EAM may be an electron accepting moiety, and

LM may be a pi conjugated linking moiety to link the electron donating moiety and the electron accepting moiety.

For example, the p-type semiconductor of the photoelectric conversion layer 130 may be represented by Chemical Formula 4.

[Chemical Formula 4]

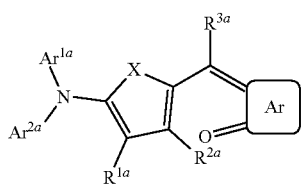

In Chemical Formula 4,

X may be O, S, Se, Te, SO, $SO_2$, $CR^bR^c$, or $SiR^dR^e$,

Ar may be a substituted or unsubstituted C6 to C30 arylene group, a substituted or unsubstituted C3 to C30 heterocyclic group, or a fused ring of two or more selected therefrom, $Ar^{1a}$ and $Ar^{2a}$ may each independently be a substituted or unsubstituted C6 to C30 aryl(ene) group or a substituted or unsubstituted C3 to C30 heteroaryl(ene) group, $R^{1a}$ to $R^{3a}$ and $R^b$ to $R^e$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or any combination thereof, and $Ar^{1a}$, $Ar^{2a}$, $R^{1a}$, and $R^{2a}$ may each independently be present, or two adjacent ones may be linked to each other to form a ring.

For example, $Ar^{1a}$ and $Ar^{2a}$ may each independently be a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, $Ar^{1a}$ and $Ar^{2a}$ may be linked to each other to form a ring.

For example, $Ar^{2a}$ and $R^{1a}$ may be linked to each other to form a ring.

In some example embodiments, the semiconductor thin layer 19 of the transistor of FIG. 1 may at least partially comprise a compound represented by Chemical Formula 4.

For example, the n-type semiconductor may be fullerene or a fullerene derivative, thiophene or a thiophene derivative, or any combination thereof, but is not limited thereto. In some example embodiments, the semiconductor thin layer 19 of the transistor of FIG. 1 may at least partially comprise fullerene or a fullerene derivative, thiophene or a thiophene derivative, or any combination thereof.

The photoelectric conversion layer 130 may be an intrinsic layer (I-layer) in which a p-type semiconductor and an n-type semiconductor are blended in a bulk heterojunction. At this time, the p-type semiconductor and the n-type semiconductor may be blended in a volume ratio (thickness ratio) of about 1:9 to about 9:1, and within the above range, about 2:8 to about 8:2, within the above range, about 3:7 to about 7:3, within the above range, about 4:6 to about 6:4, or within the above range, about 5:5.

The photoelectric conversion layer 130 may include a bi-layer including a p-type layer including the p-type semiconductor and an n-type layer including the n-type semiconductor. In this case, the thickness ratio of the p-type layer and the n-type layer may be about 1:9 to about 9:1, and within the above range, for example, about 2:8 to about 8:2, about 3:7 to about 7:3, about 4:6 to about 6:4, or about 5:5.

The photoelectric conversion layer 130 may further include a p-type layer and/or an n-type layer in addition to the intrinsic layer. The p-type layer may include the aforementioned p-type semiconductor, and the n-type layer may include the aforementioned n-type semiconductor. For example, the photoelectric conversion layer 130 may include in various combinations such as p-type layer/I-layer, I-layer/n-type layer, p-type layer/I-layer/n-type layer, and the like.

The photoelectric conversion layer 130 may have a thickness of about 1 nm to about 500 nm, and within the above range, about 5 nm to about 300 nm. Within the above thickness range, photoelectric conversion efficiency may be effectively improved by effectively absorbing light and effectively separating and transferring holes and electrons.

The auxiliary layers 140 and 150 may include a first auxiliary layer 140 between the first electrode 110 and the photoelectric conversion layer 130 and a second auxiliary layer 150 between the second electrode 120 and the photoelectric conversion layer 130. The first and second auxiliary layers 140 and 150 may each independently be a charge auxiliary layer for controlling the mobility of holes and/or electrons separated from the photoelectric conversion layer 130 or a light absorption auxiliary layer for improving light absorption characteristics.

The first and second auxiliary layers 140 and 150 may each include an independent organic material, an inorganic material, and/or an organic-inorganic material. The first and second auxiliary layers 140 and 150 may include at least one of a hole injecting layer HIL, a hole transporting layer HTL, an electron blocking layer EBL, an electron injecting layer EIL, an electron transporting layer ETL, a hole blocking layer HBL, or a light absorption auxiliary layer, but are not limited thereto.

The hole injection layer, the hole transport layer, and/or the electron blocking layer may include, for example, a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4', 4''-[tris(3-methylphenyl)phenylamino]triphenylamine), TDATA (4,4'4''-tris(N,N-diphenylamino)triphenylamine), 2-TNATA (4,4',4''-tris{N,-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-1-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h] quinoxaline-2,3,6,7,10,11-hexacarbonitrile), a carbazole-based derivative such as N-phenylcarbazole, polyvinylcarbazole, and the like, a fluorene-based derivative, TPD (N,N'-bis(3-methylphenyl)-N,N'-diphenyl-[1,1-biphenyl]-4,4'-diamine), a triphenylamine-based derivative such as TCTA (4,4',4''-tris(N-carbazolyl)triphenylamine), NPB (N,N'-di(naphthalene-I-yl)-N,N'-diphenylbenzidine), TAPC (4,4'-cyclohexylidene bis[N,N-bis(4- methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto.

The electron injection layer, the electron transport layer, and/or the hole blocking layer may be, for example, a halogenated metal such as LiF, NaCl, CsF, RbCl, and RbI; a lanthanide metal such as Yb; a metal such as calcium (Ca), potassium (K), aluminum (Al), or an alloy thereof; a metal oxide such as $Li_2O$ or BaO; Liq (lithium quinolate), Alq3 (tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), Balq (bis(2-methyl-8-quinolinolato-N1,O8)-(1,1'-biphenyl-4-olato)aluminum), $Bebq_2$ (beryllium bis(benzoquinolin-10-olate), ADN (9,10-di(naphthalene-2-yl)anthracene), BmPyPhB (1,3-bis[3,5-di(pyridin-3-yl)phenyl]benzene), or any combination thereof, but is not limited thereto.

The light absorption auxiliary layer may include, for example, fullerene or a fullerene derivative.

At least one of the first or second auxiliary layers 140 or 150 (either or both of the first and second auxiliary layers 140 and 150) may be omitted.

In addition to the aforementioned first and second auxiliary layers 140 and 150, the sensor 100 may further include one or more additional auxiliary layers (not shown) between the first electrode 110 and the photoelectric conversion layer 130 and/or between the second electrode 120 and the photoelectric conversion layer 130. The additional auxiliary layer may be between the first electrode 110 and the first auxiliary layer 140, between the first auxiliary layer 140 and the photoelectric conversion layer 130, between the second electrode 120 and the second auxiliary layer 150, and/or between the photoelectric conversion layer 130 and the second auxiliary layer 150. The additional auxiliary layer may include an organic material, an inorganic material, and/or an organic-inorganic material.

The sensor 100 may further include an anti-reflection layer (not shown) under the first electrode 110 or on the second electrode 120. For example, when the first electrode 110 is a light-receiving electrode, the anti-reflection layer may be disposed under the first electrode 110. For example, when the second electrode 120 is a light-receiving electrode, the anti-reflection layer may be disposed on the second electrode 120. The anti-reflection layer is disposed at a light incidence side and may lower reflectance of light of incident light and thereby light absorbance may be further improved. The anti-reflection layer may include, for example a material having a refractive index of about 1.6 to about 2.5, and may include for example at least one of metal oxide, metal sulfide, or an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or any combination thereof; a metal sulfide such as zinc sulfide; or an organic material such as an amine derivative, but is not limited thereto.

The sensor 100 may further include a focusing lens (not shown). The focusing lens may collect the light to a single point by controlling the direction of the incident light at a light incident position. The focusing lens may have a shape of, for example, a cylinder or a hemisphere, but is not limited thereto.

In the sensor 100, when light enters from the first electrode 110 or the second electrode 120 and the photoelectric conversion layer 130 may absorb light in a particular (or, alternatively, predetermined) wavelength region, excitons may be produced thereinside. The excitons may be separated into holes and electrons in the photoelectric conversion layer 130, and the separated holes are transported to an anode that is one of the first electrode 110 or the second electrode 120 and the separated electrons are transported to the cathode that is the other of the first electrode 110 or the second electrode 120 so as to flow a current.

The sensor 100 may be included in, for example, an image sensor or a biometric sensor.

For example, the aforementioned sensor 100 may be included in an image sensor, and as described above, has improved optical and electrical properties and reduces an image afterimage due to remaining charges, thereby being applied to an image sensor suitable for high-speed photographing.

Hereinafter, an image sensor according to some example embodiments is described.

Figure 3:
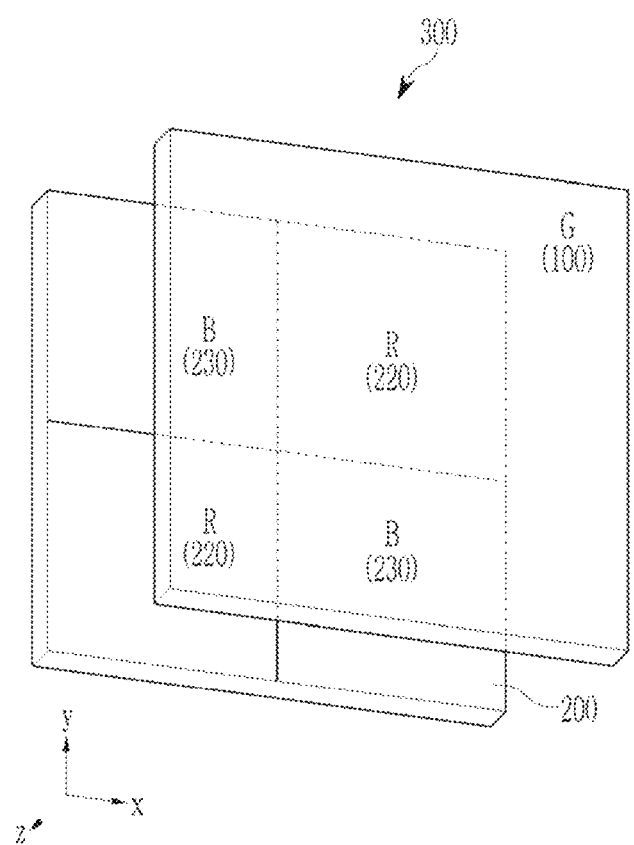
FIG. 3 is a plan view showing an example of an image sensor according to some example embodiments.
Figure 4:
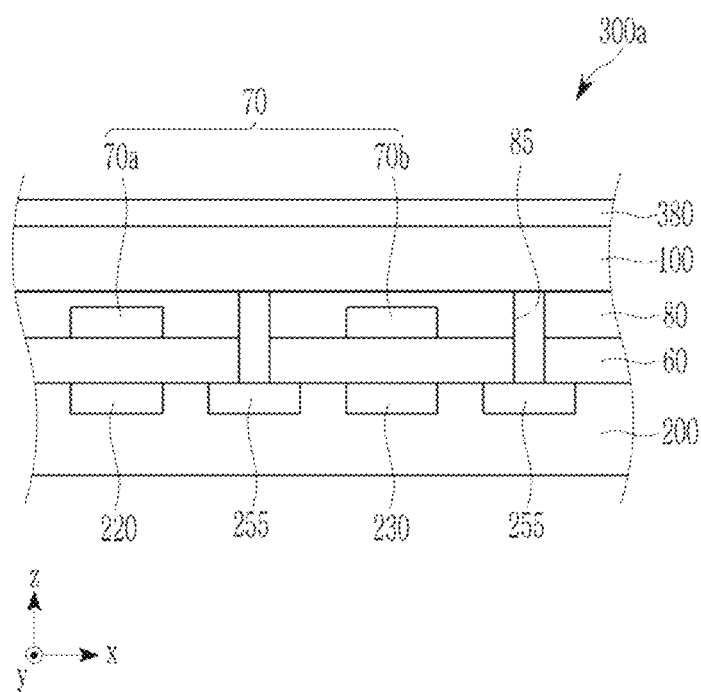
FIG. 4 is a cross-sectional view showing an example of the image sensor of FIG. 3 according to some example embodiments.

FIG. 3 is a plan view showing an example of an image sensor according to some example embodiments, and FIG. 4 is a cross-sectional view showing an example of the image sensor of FIG. 3 according to some example embodiments.

Referring to FIG. 3, the image sensor 300 according to some example embodiments may be a stacked sensor in which a semiconductor substrate 200 and the aforementioned sensor 100 are stacked, and the semiconductor substrate 200 includes a first photodiode 220 and a second photodiode 230 which are overlapped (e.g., vertically overlapped) with the sensor 100. FIG. 3 illustrates an example of a repeating unit pixel group in the image sensor 300, and the unit pixel group is repeatedly arranged along rows and/or columns. In FIG. 3, the unit pixel group is shown for example as a 2×2 array in which two red pixels R and two blue pixels B are arranged on a semiconductor substrate 200, but example embodiments are not limited thereto.

A first photodiode 220 and a second photodiode 230 are each integrated on (e.g., at least partially encompassed within) the semiconductor substrate 200 and thus may be configured to absorb and convert light (e.g., incident light) having each different wavelength spectrum which is filtered (e.g., selectively transmitted) by a color filter layer 70, which will be described later. A wavelength spectrum photoelectrically converted in the sensor 100 may be different respectively from the wavelength spectra photoelectrically converted in the first photodiode 220 and the second photodiode 230, for example, the wavelength spectrum photoelectrically converted in the first photodiode 220 and the wavelength spectrum photoelectrically converted in the second photodiode 230 may be respectively different from the wavelength spectrum photoelectrically converted in the sensor 100 and selected from light of a red wavelength spectrum, a green wavelength spectrum, and a blue wavelength spectrum. For example, the first photodiode 220 may be configured to photoelectrically convert light (e.g., incident light) of the red wavelength spectrum R, the second photodiode 230 may be configured to photoelectrically convert light (e.g., incident light) of the blue wavelength spectrum B, and the sensor 100 may be configured to photoelectrically convert light (e.g., incident light) of the green wavelength spectrum G.

Referring to FIG. 4, an image sensor 300a according to some example embodiments includes a semiconductor substrate 200 (also referred to herein interchangeably as a substrate 200), a lower insulation layer 60, a color filter layer 70, an upper insulation layer 80, a sensor 100, and an encapsulation layer 380.

The first and second photodiodes 220 and 230, a transmission transistor (not shown) and the charge storage 255 are integrated in the semiconductor substrate 200. The first or second photodiode 220 or 230, transmission transistor and/or charge storage 255 may be integrated for each pixel. As shown in the drawing, the first photodiode 220 may be included in the red pixel R and the second photodiode 230 may be included in the blue pixel B. The charge storage 255 is electrically connected to the sensor 100. The transmission transistor may be the transistor shown in FIG. 1.

A metal wire (not shown) and a pad (not shown) are formed on the lower portion or upper portion of the semiconductor substrate 200. In order to decrease signal delay, the metal wire and pad may be made of a metal having low resistivity, for example, aluminum (Al), copper (Cu), silver (Ag), and alloys thereof, but is not limited thereto.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench 85 exposing the charge storage 255. The trench 85 may be filled with fillers.

The color filter layer 70 is formed on the lower insulation layer 60. The color filter layer 70 includes a red filter 70a formed in the red pixel R and a blue filter 70b formed in the blue pixel B. However, the present inventive concepts are not limited thereto, and a cyan filter, a magenta filter, and/or a yellow filter may be included instead of the red filter 70a and/or the blue filter 70b, or may be additionally included in addition to the red filter 70a and the blue filter 70b. Although an example in which the green filter is not provided is described some example embodiments, including the example embodiments shown in FIGS. 3 and 4, a green filter may be provided in some example embodiments. In some example embodiments, the color filter layer 70 may be omitted. For example, when the first and second photodiodes 220 and 230 are stacked in a vertical direction, the first and second photodiodes 220 and 230 may selectively absorb light in each wavelength region depending on their stack depth, and the color filter layer 70 may not be equipped.

The upper insulation layer 80 is formed on the color filter layer 70. The upper insulation layer 80 removes the step difference caused by the color filter layer 70 and is planarized. The upper insulation layer 80 and the lower insulation layer 60 have a contact (not shown) exposing the pad and a trench 85 exposing the charge storage 255.

The aforementioned sensor 100 is formed on the upper insulation layer 80. A detailed description of the sensor 100 is the same as described above. One of the first electrode 110 or the second electrode 120 of the sensor 100 may be electrically connected to the charge storage 255 and the other of the first electrode 110 and the second electrode 120 of the sensor 100 may be a light-receiving electrode. For example, the first electrode 110 of the sensor 100 may be electrically connected to the charge storage 255, and the second electrode 120 of the sensor 100 may be a light-receiving electrode.

The encapsulation layer 380 may protect the image sensor 300a, and may include a thin film of one or two or more layers including an organic material, an inorganic material, an organic-inorganic material, or any combination thereof. The encapsulation layer 380 may include, for example, a glass plate, a metal thin film, an organic layer, an inorganic layer, an organic-inorganic layer, or any combination thereof. The organic film may include, for example, an acrylic resin, a (meth)acrylic resin, polyisoprene, a vinyl resin, an epoxy resin, a urethane resin, a cellulose resin, a perylene resin, or any combination thereof, but is not limited thereto. The inorganic film may include, for example, an oxides, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or any combination thereof, but is not limited thereto. The organic-inorganic film may include, for example, polyorganosiloxane, but is not limited thereto. The encapsulation layer 380 may be one layer or two or more layers. The encapsulation layer 380 may be omitted.

A focusing lens (not shown) may be further formed on the sensor 100 (or the encapsulation layer 380). The focusing lens may control the direction of the incident light to collect the light to a single point. The focusing lens may have a shape of, for example, a cylinder or a hemisphere, but is not limited thereto.

Figure 5:
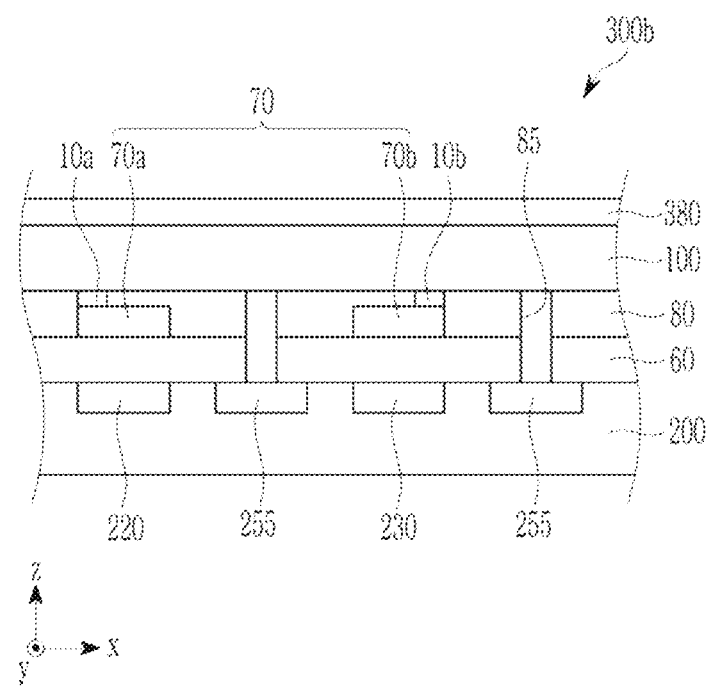
FIG. 5 is a cross-sectional view showing an example of the image sensor of FIG. 3 according to some example embodiments.

FIG. 5 is a cross-sectional view showing an example of the image sensor of FIG. 3 according to some example embodiments.

Referring to FIG. 5, the image sensor 300b according to some example embodiments includes a semiconductor substrate 200 in which first and second photodiodes 220 and 230, a transmission transistor (not shown), and a charge storage 255 are integrated, a lower insulation layer 60, a color filter layer 70, an upper insulation layer 80, and a sensor 100, as in some example embodiments, including the example embodiments shown in FIGS. 3 and 4. The transmission transistor may be the transistor shown in FIG. 1.

However, the image sensor 300b according to some example embodiments, including the example embodiments shown in FIG. 5, may further include a transistor 10a on the red filter 70a of the color filter layer 70 and a transistor 10b on the blue filter 70b of the color filter layer 70, unlike some example embodiments, including the example embodiments shown in FIG. 4. The transistors 10a and 10b may be the transistors shown in FIG. 1. Since the transistors 10a and 10b have excellent transparency and light transmittance, they may be disposed on the color filter. In FIG. 5, the transistors 10a and 10b are illustrated as being overlapped with the distal end of the color filter, but the present inventive concepts are not limited thereto.

The transistor (e.g., one or more of the transistors 10a and 10b) may be disposed under each color filter of the color filter layer 70. This structure is shown in FIG. 6.

Figure 6:
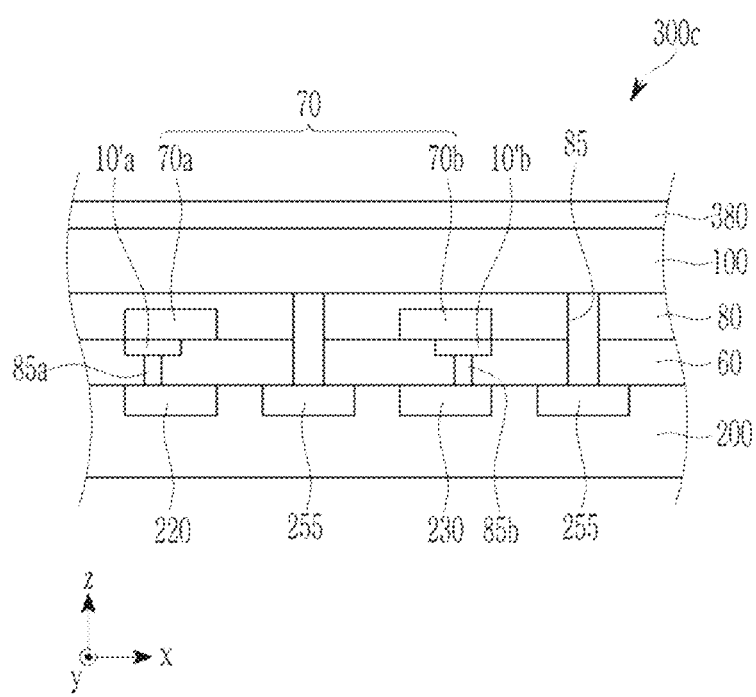
FIG. 6 is a cross-sectional view showing an example of the image sensor of FIG. 3 according to some example embodiments.

FIG. 6 is a cross-sectional view illustrating an example of the image sensor of FIG. 3 according to some example embodiments.

Referring to FIG. 6, the image sensor 300c according to some example embodiments includes a semiconductor substrate 200 in which first and second photodiodes 220 and 230, a transmission transistor (not shown), and a charge storage 255 are integrated, a lower insulation layer 60, a color filter layer 70, an upper insulation layer 80, and a sensor 100, as in some example embodiments, including the example embodiments shown in FIGS. 3 and 4. The transmission transistor may be the transistor shown in FIG. 1.

However, the image sensor 300c according to some example embodiments, including the example embodiments shown in FIG. 6, may include a transistor 10'a under the red filter 70a of the color filter layer 70 and a transistor 10'b under the blue filter 70b of the color filter layer 70, unlike some example embodiments, including the example embodiments shown in FIGS. 4 and 5. The transistors 10'a and 10'b are connected to the first and second photodiodes 220 and 230 through trenches 85a and 85b, respectively.

Figure 7:
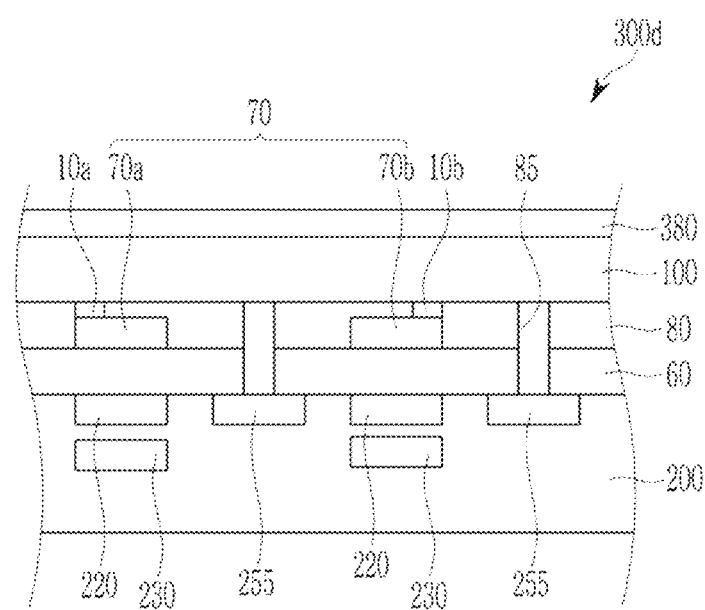
FIG. 7 is a cross-sectional view showing an example of the image sensor of FIG. 3 according to some example embodiments.

FIG. 7 is a cross-sectional view illustrating an example of the image sensor of FIG. 3 according to some example embodiments.

Referring to FIG. 7, the image sensor 300d according to some example embodiments includes a semiconductor substrate 200 in which first and second photodiode 220 and 230, a transmission transistor (not shown), and a charge storage 255 are integrated, a lower insulation layer 60, an upper insulation layer 80, and a sensor 100, as in some example embodiments, including the example embodiments shown in FIGS. 3 and 4. The transmission transistor may be the transistor shown in FIG. 1.

However, the image sensor 300d according to some example embodiments, including the example embodiments shown in FIG. 7, may further include a transistor 10a on the red filter 70a of the color filter layer 70 and a transistor 10b on the blue filter 70b of the color filter layer 70 as in the image sensor 300b illustrated in FIG. 5. The transistors 10a and 10b may be the transistors shown in FIG. 1. Since the transistors 10a and 10b have excellent transparency and light transmittance, they may be disposed on the color filters 70a and 70b of the color filter layer 70. The transistors 10a and 10b may be disposed under the color filters 70a and 70b of the color filter layer 70 as in the image sensor 300c illustrated in FIG. 6.

However, in the image sensor 300d according to some example embodiments, including the example embodiments shown in FIG. 7, the first and second photodiodes 220 and 230 are stacked in a vertical direction with respect to the plane direction of the semiconductor substrate 200, unlike some example embodiments, including the example embodiments shown in FIGS. 4 to 6. The first and second photodiodes 220 and 230 are electrically connected to a charge storage (not shown) and may be transferred by a transmission transistor. The first and second photodiodes 220 and 230 may be configured to selectively absorb light (e.g., incident light) in each wavelength region according to the stacking depth.

The sensor 100 is the same as described above. One of the first electrode 110 or the second electrode 120 of the sensor 100 may be a light-receiving electrode, and the other of the first electrode 110 and the second electrode 120 of the sensor 100 may be electrically connected to the charge storage 255.

Figure 8:
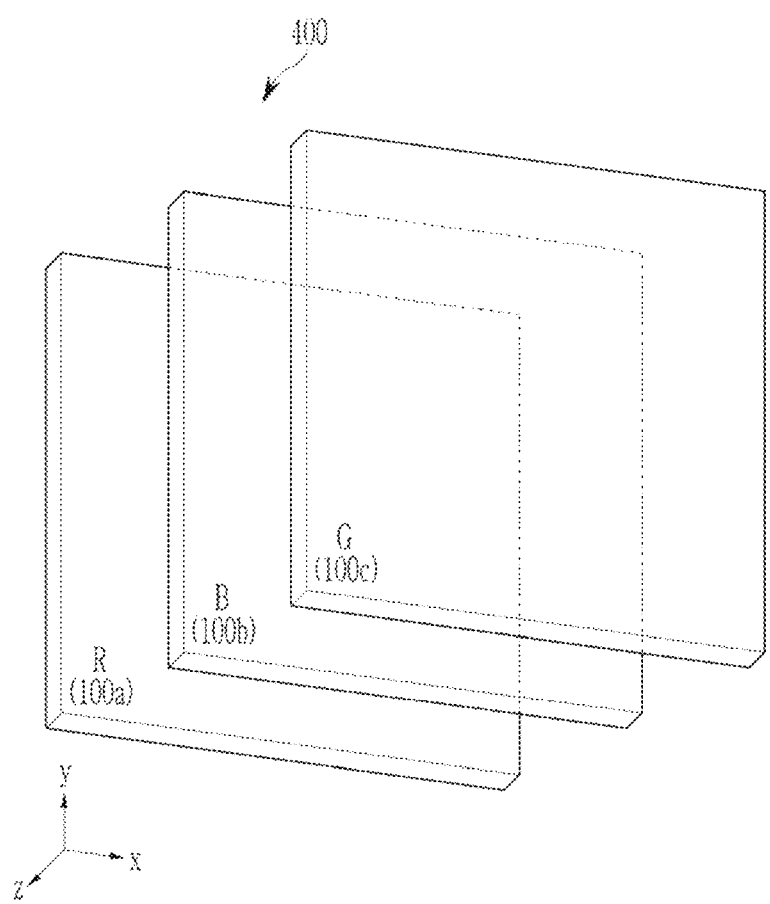
FIG. 8 is a plan view showing an example of an image sensor according to some example embodiments.
Figure 9:
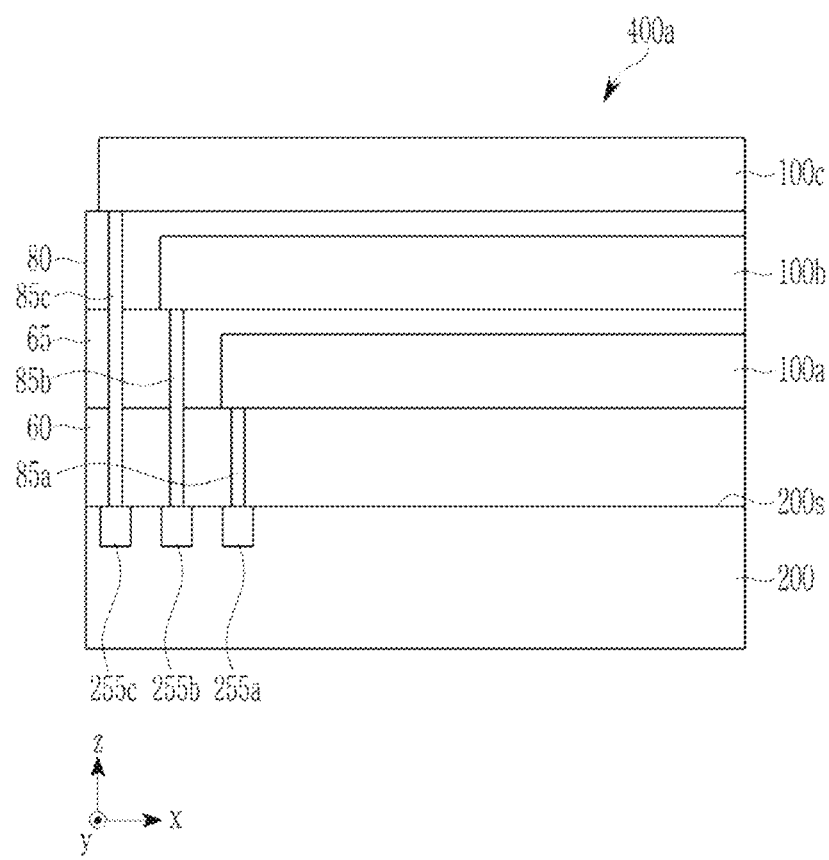
FIG. 9 is a cross-sectional view showing an example of the image sensor of FIG. 8 according to some example embodiments.

FIG. 8 is a plan view showing an example of an image sensor according to some example embodiments, and FIG. 9 is a cross-sectional view showing an example of the image sensor of FIG. 8 according to some example embodiments.

The image sensor 400 according to some example embodiments, including the example embodiments shown in FIG. 8, may have a structure in which a green sensor configured to selectively absorb light in a green wavelength spectrum, a blue sensor configured to selectively absorb light in a blue wavelength spectrum, and a red sensor configured to selectively absorb light in a red wavelength spectrum are stacked, for example stacked vertically in a vertical direction extending perpendicular to a surface (e.g., upper surface 200s) of the substrate 200 (e.g., the z-axis direction).

The image sensor 400a according to some example embodiments, including the example embodiments shown in FIG. 9, may include a semiconductor substrate 200, a lower insulation layer 60, an intermediate insulation layer 65, an upper insulation layer 80, a first sensor 100a, a second sensor 100b, and a third sensor 100c.

The semiconductor substrate 200 may be a silicon substrate, and a transmission transistor (not shown) and charge storages 255a, 255b, and 255c are integrated therein.

A metal wire (not shown) and a pad (not shown) are formed on the semiconductor substrate 200, and a lower insulation layer 60 is formed on the metal wire and the pad.

The first sensor 100a, the second sensor 100b, and the third sensor 100c are sequentially formed on the lower insulation layer 60.

The first, second, and third sensors 100a, 100b, and 100c may each be the aforementioned sensor 100. For example, any one of the first, second, and/or third sensors 100a, 100b, and/or 100c may be the aforementioned sensor 100. One of the first electrode 110 or the second electrode 120 of the first, second, and third sensors 100a, 100b, and 100c may be a light-receiving electrode, and the other of the first electrode 110 or the second electrode 120 of the first, second, and third sensors 100a, 100b, and 100c may be connected to one or more of the charge storages 255a, 255b, and 255c.

The first sensor 100a (e.g., the photoelectric conversion layer 130 of the first sensor 100a) may be configured to selectively absorb light in any one wavelength region of red, blue, or green to photoelectrically convert it. For example, the first sensor 100a may be a red sensor. The intermediate insulation layer 65 is formed on the first sensor 100a.

The second sensor 100b is formed on the intermediate insulation layer 65. The second sensor 100b (e.g., the photoelectric conversion layer 130 of the second sensor 100b) may be configured to selectively absorb light of any one wavelength region among red, blue, or green to photoelectrically convert it. For example, the second sensor 100b may be a blue sensor.

The upper insulation layer 80 is formed on the second sensor 100b. The lower insulation layer 60, the intermediate insulation layer 65, and the upper insulation layer 80 have a plurality of trenches 85a, 85b, and 85c exposing charge storages 255a, 255b, and 255c.

The third sensor 100c is formed on the upper insulation layer 80. The third sensor 100c (e.g., the photoelectric conversion layer 130 of the third sensor 100c) may be configured to selectively absorb light of any one wavelength region among red, blue, or green to photoelectrically convert it. For example, the third sensor 100c may be a green sensor.

A focusing lens (not shown) may be further formed on the third sensor 100c. The focusing lens may control the direction of the incident light to collect the light to a single point. The focusing lens may have a shape of, for example, a cylinder or a hemisphere, but is not limited thereto.

Although the drawing shows a structure in which the first sensor 100a, the second sensor 100b, and the third sensor 100c are sequentially stacked, the stacking order is not limited thereto and the stacking order may be variously changed.

As described above, the first sensor 100a, the second sensor 100b, and the third sensor 100c configured to absorb light in different wavelength spectra are stacked, thereby further reducing a size of the image sensor to provide a miniaturized image sensor.

Figure 10:
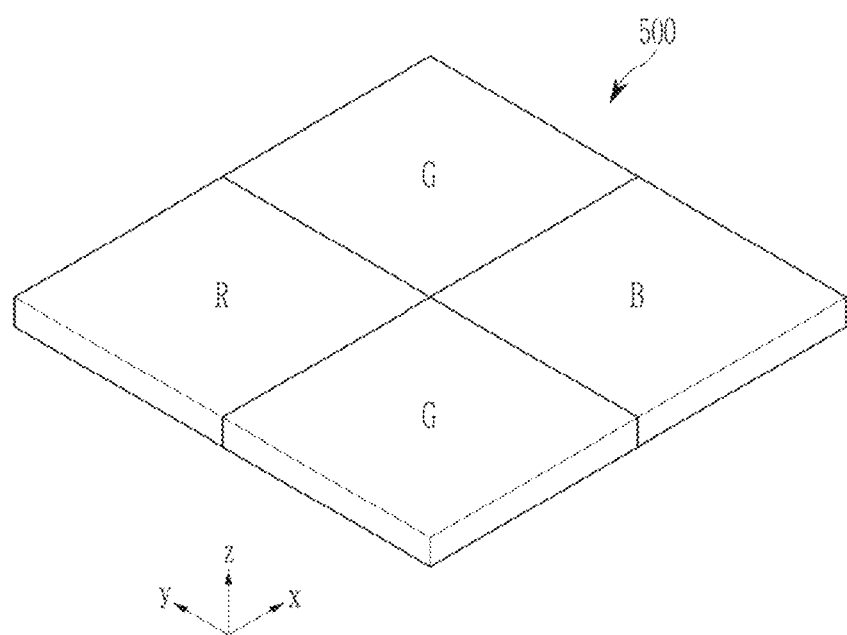
FIG. 10 is a plan view showing another example of an image sensor according to some example embodiments.
Figure 11:
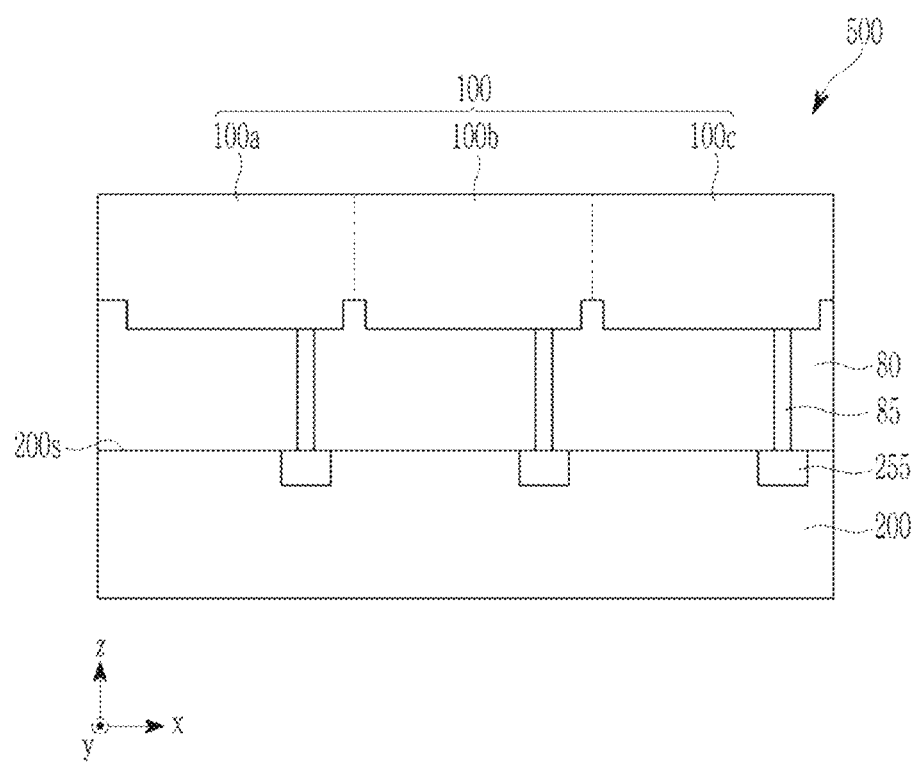
FIG. 11 is a cross-sectional view showing an example of the image sensor of FIG. 10 according to some example embodiments.

FIG. 10 is a plan view showing an example of an image sensor according to some example embodiments, and FIG. 11 is a cross-sectional view showing an example of the image sensor of FIG. 10 according to some example embodiments.

Referring to FIGS. 10 and 11, the image sensor 500 includes the sensor 100 on the semiconductor substrate 200, and the sensor 100 includes the first, second, and third sensors 100a, 100b, and 100c. The first, second, and third sensors 100a, 100b, and 100c may be configured to convert light (e.g., incident light) of different wavelength spectra (e.g., blue light, green light, or red light) into electrical signals. For example, the first, second, and third sensors 100a, 100b, and 100c may include respective photoelectric conversion layers 130 configured to selectively absorb and photoelectrically convert different wavelength regions of incident light.

Referring to FIG. 11, the first, second, and third sensors 100a, 100b, and 100c are arranged in a parallel direction to the surface (e.g., upper surface 200s) of the substrate 200 unlike some example embodiments, including the example embodiments shown in FIGS. 8 and 9. Each first, second, and third sensor 100a, 100b, and 100c is electrically connected to the charge storage 255 integrated in the substrate 200 through the trench 85.

For example, the aforementioned sensor 100 may be included in a display panel, and may be, for example, applied to (e.g., included in) a sensor-embedded display panel in which the sensor 100 is embedded in the display panel.

Hereinafter, a sensor-embedded display panel including the aforementioned sensor is described.

The sensor-embedded display panel according to some example embodiments may be a display panel capable of performing a display function and a recognition function (e.g., biometric recognition function), and may be an in-cell type display panel in which a sensor performing a recognition function (e.g., biometric recognition function) is embedded in the display panel.

Figure 12:
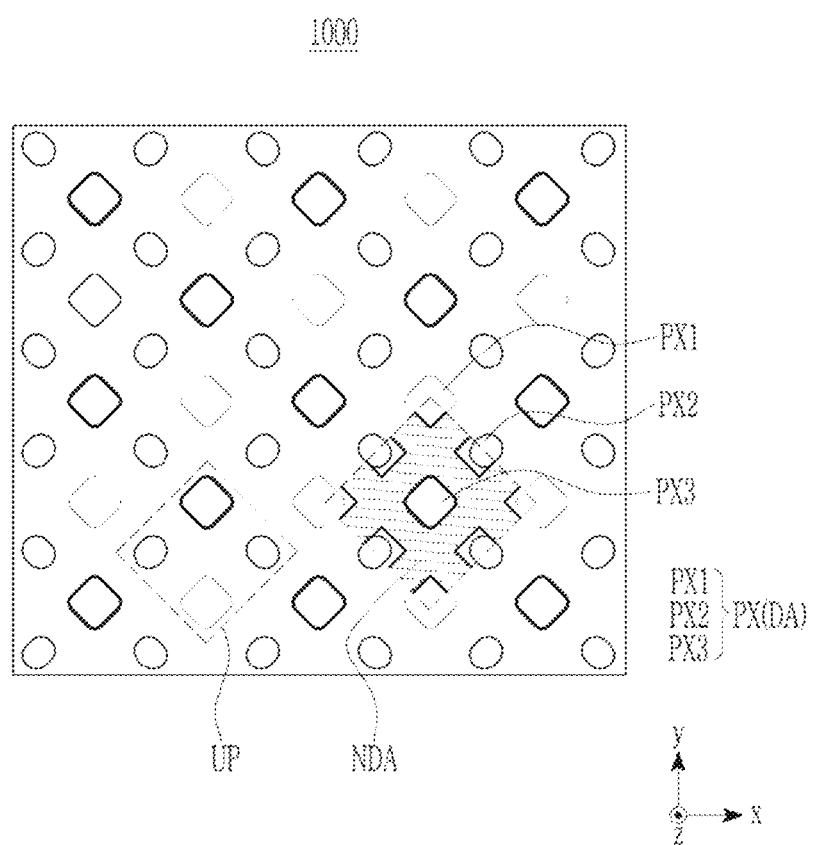
FIG. 12 is a plan view illustrating an example of a sensor-embedded display panel according to some example embodiments.
Figure 13:
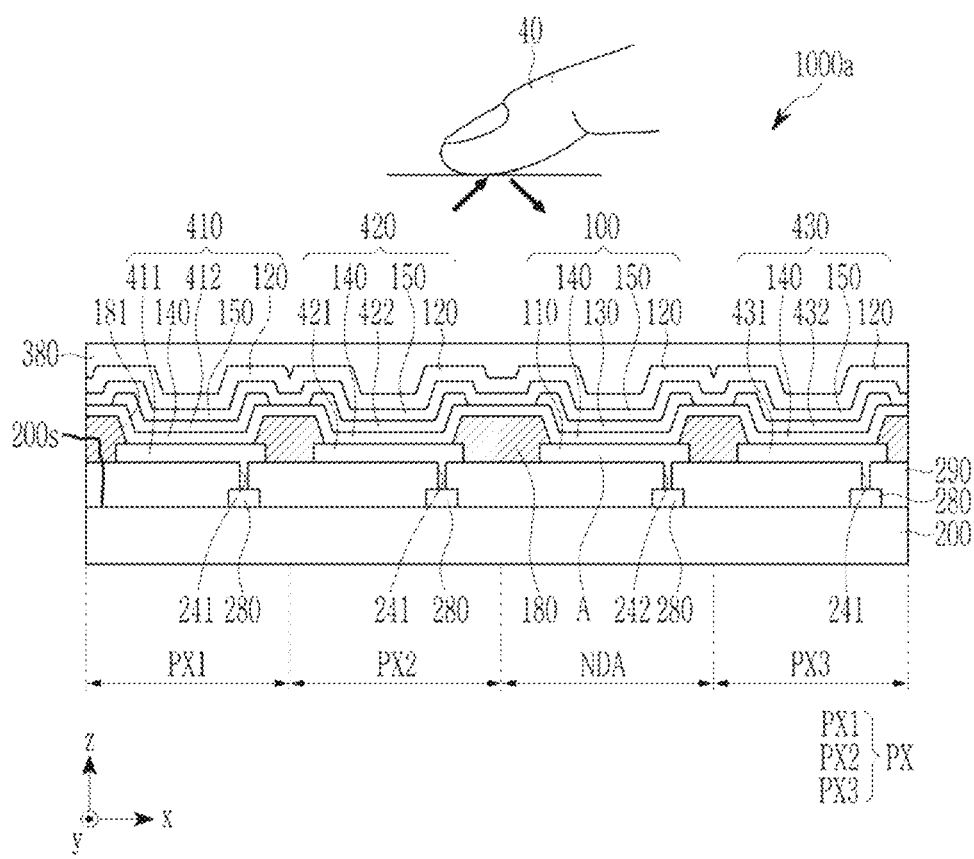
FIG. 13 is a cross-sectional view illustrating an example of a sensor-embedded display panel according to some example embodiments.

FIG. 12 is a plan view illustrating an example of a sensor-embedded display panel according to some example embodiments, and FIG. 13 is a cross-sectional view illustrating an example of a sensor-embedded display panel according to some example embodiments.

Referring to FIGS. 12 and 13, a sensor-embedded display panel 1000 according to some example embodiments includes a plurality of subpixels PXs configured to display different colors. The plurality of subpixels PXs may be configured to display at least three primary colors, for example, a first subpixel PX1, a second subpixel PX2, and a third subpixel PX3 configured to display different first color, second color, and third color selected from red, green, and blue. For example, the first color, the second color, and the third color may be red, green, and blue, respectively. The first subpixel PX1 may be a red subpixel configured to display red, the second subpixel PX2 may be a green subpixel configured to display green, and the third subpixel PX3 may be a blue subpixel configured to display blue. However, the present inventive concepts are not limited thereto, and an auxiliary subpixel (not shown) such as a white subpixel may be further included. Displaying a color may refer to emitting light corresponding to the color (e.g., light in a wavelength spectrum of the color). Referring to FIGS. 12 and 13, the sensor-embedded display panel 1000 may include a plurality of first subpixels PX1 configured to display a red color (e.g., light of a red wavelength spectrum) and including a first light emitting element (e.g., the first light emitting element 410 shown in FIG. 13), a plurality of second subpixels PX2 configured to display a green color (e.g., light of a green wavelength spectrum) and including a second light emitting element (e.g., the second light emitting element 420 shown in FIG. 13), and a plurality of third subpixels PX3 configured to display a blue color (e.g., light of a blue wavelength spectrum) and including a third light emitting element (e.g., the third light emitting element 430 shown in FIG. 13), where the first subpixels PX1, the second subpixels PX2, and the third subpixels PX3 are located in and/or at least partially define the display area (DA).

The plurality of subpixels PXs including the first subpixel PX1, the second subpixel PX2, and the third subpixel PX3 may constitute one unit pixel UP to be arranged repeatedly along the row and/or column. In FIG. 12, a structure including one first subpixel PX1, two second subpixels PX2, and one third subpixel PX3 in the unit pixel UP is illustrated, but the present inventive concepts are not limited thereto. At least one first subpixel PX1, at least one second subpixel PX2, and at least one third subpixel PX3 may be included. In the drawing, as an example, an arrangement of a Pentile type is illustrated, but the present inventive concepts are not limited thereto. The subpixels PXs may be arranged variously. An area occupied by the plurality of subpixels PXs and configured to display colors by the plurality of subpixels PXs may be a display area DA configured to display an image. For example, the area (e.g., in the xy plane) of the subpixels (PX) may collectively define the display area (DA) that is configured to display an image thereon (e.g., configured to display one or more colors). A portion of the area (e.g., in the xy plane) of the sensor-embedded display panel 1000/1000a that excludes the display area (DA) (e.g., portions of the area of the sensor-embedded display panel 1000/1000a that are between adjacent subpixels (PX) in the xy direction, xy plane, etc.) may be a non-display area (NDA) that is configured to not display an image thereon (e.g., configured to not display any color).

Each of the first subpixel PX1, the second subpixel PX2, and the third subpixel PX3 may include a light emitting element. As an example, the first subpixel PX1 may include a first light emitting element 410 configured to emit light of a wavelength spectrum of a first color, the second subpixel PX2 may include a second light emitting element 420 configured to emit light of a wavelength spectrum of a second color, and the third subpixel PX3 may include a third light emitting element 430 configured to emit light of a wavelength spectrum of a third color. However, the present inventive concepts are not limited thereto, and at least one of the first subpixel PX1, the second subpixel PX2, or the third subpixel PX3 may include a light emitting element configured to emit light of any combination of a first color, a second color, or a third color, that is, light in a white wavelength spectrum, and may be configured to display a first color, a second color, or a third color through a color filter (not shown). Herein, the terms "wavelength spectrum" and "wavelength region" may be used interchangeably.

The sensor-embedded display panel 1000 according to some example embodiments includes the aforementioned sensor 100. The sensor 100 may be disposed in a non-display area NDA. The non-display area NDA may be an area other than the display area DA, in which the first subpixel PX1, the second subpixel PX2, the third subpixel PX3, and auxiliary subpixels are not arranged (e.g., a portion of the total area of the sensor-embedded display panel 1000 that excludes the display area (DA), excludes the subpixels (PX), is between adjacent subpixels (PX), etc.). For example, the area (e.g., in the xy plane) of the subpixels (PX) may collectively define the display area (DA) that is configured to display an image thereon (e.g., configured to display one or more colors). A portion of the area (e.g., in the xy plane) of the sensor-embedded display panel 1000 that excludes the display area (DA) (e.g., portions of the area of the sensor-embedded display panel 1000 that are between adjacent subpixels (PX) in the xy direction, xy plane, etc.) may be a non-display area (NDA) that is configured to not display an image thereon (e.g., configured to not display any color). The aforementioned sensor 100 may be disposed between at least two subpixels selected from the first subpixel PX1, the second subpixel PX2, and the third subpixel PX3 (e.g., between at least two subpixels of a first subpixel PX1 of a plurality of first subpixels PX1, a second subpixel PX2 of the plurality of second subpixels PX2, or a third subpixel PX3 of the plurality of third subpixels PX3), and may be disposed in parallel with the first, second, and third light emitting elements 410, 420, and 430 in the display area DA, for example in parallel along the in-plane direction of the semiconductor substrate 200 (e.g., the xy direction as shown), which may be a direction extending parallel to an upper surface 200s of the semiconductor substrate 200.

The sensor 100 may be an optical type recognition sensor (e.g., biometric sensor). The sensor 100 may be configured to absorb light emitted from at least one of the first, second or third light emitting elements 410, 420, or 430 in the display area DA and then reflected by a recognition target 40 such as a living body, a tool, or a thing, and convert the absorbed light into an electrical signal. Herein, the living body may be a finger, a fingerprint, a palm, an iris, a face, and/or a wrist, but is not limited thereto. The sensor 100 may be, for example, a fingerprint sensor, an illumination sensor, an iris sensor, a distance sensor, a blood vessel distribution sensor, and/or a heart rate sensor, but is not limited thereto.

The sensor 100 may be disposed on the substrate 200 in the same plane as the first, second, and third light emitting elements 410, 420, and 430, and may be embedded in the sensor-embedded display panel 1000. Restated, the sensor 100 may be in parallel with the first, second, and third light emitting elements 410, 420, and 430 on the semiconductor substrate 200 along an in-plane direction of the semiconductor substrate 200.

Referring to FIG. 13, the sensor-embedded display panel 1000a includes a substrate 200; a thin film transistor 280 on the substrate 200; an insulation layer 290 on thin film transistor 280; a pixel definition layer 180 on the insulation layer 290; and first, second, or third light emitting elements 410, 420, and 430 and the sensor 100 in a space partitioned by (e.g., at least partially defined by) the pixel definition layer 180. The thin film transistor 280 may be the transistor shown in FIG. 1.

The substrate 200 may be a light-transmitting substrate, for example, a glass substrate or a polymer substrate. The polymer substrate may include, for example, polycarbonate, polymethylmethacrylate, polyethyleneterephthalate, polyethylenenaphthalate, polyimide, polyamide, polyamideimide, polyethersulfone, polyorganosiloxane, styrene-ethylene-butylene-styrene, polyurethane, polyacrylate, polyolefin, or any combination thereof, but is not limited thereto.

A plurality of thin film transistors 280 are formed on the substrate 200. One or more thin film transistor 280 may be included in each subpixel PX, and may include, for example, at least one switching thin film transistor and/or at least one driving thin film transistor. The substrate 200 on which the thin film transistor 280 is formed may be referred to as a thin film transistor substrate (TFT substrate) or a thin film transistor backplane (TFT backplane).

The insulation layer 290 may cover the substrate 200 and the thin film transistor 280 and may be formed on the whole surface of the substrate 200. The insulation layer 290 may be a planarization layer or a passivation layer, and may include an organic insulating material, an inorganic insulating material, an organic-inorganic insulating material, or any combination thereof. The insulation layer 290 may have a plurality of contact holes 241 for connecting the first, second, and third light emitting elements 410, 420, and 430 and the thin film transistor 280 and one or more contact holes 242 for electrically connecting the sensor 100 and the thin film transistor 280. The insulation layer 290 may include an organic, inorganic, or organic-inorganic insulating material, in some example embodiments, an inorganic insulating material such as silicon oxide, silicon nitride, silicon oxynitride, aluminum oxide, aluminum nitride, or aluminum oxynitride; an organic insulating material such as polyimide, polyamide, polyamideimide, or polyacrylate; or an organic-inorganic insulating material such as polyorganosiloxane or polyorganosilazane.

The pixel definition layer 180 may also be formed on the whole surface of the substrate 200 and may be disposed between adjacent subpixels PX's to partition each subpixel PX. The pixel definition layer 180 may have a plurality of openings 181 in each subpixel PX, and in each opening 181, any one of first, second, or third light emitting elements 410, 420, or 430 or the sensor 100 may be disposed. The pixel definition layer 180 may be an insulation layer that may include an organic, inorganic, or organic-inorganic insulating material, in some example embodiments, an inorganic insulating material such as silicon oxide, silicon nitride, or silicon oxynitride; an organic insulating material such as polyimide; or an organic-inorganic insulating material such as polyorganosiloxane or polyorganosilazane.

The first, second and third light emitting elements 410, 420, and 430 are formed on the substrate 200 (or thin film transistor substrate), and are repeatedly arranged along the plane direction (e.g., xy direction) of the substrate 200 (also referred to as an in-plane direction of the substrate 200). As described above, the first, second, and third light emitting elements 410, 420, and 430 may be included in the first subpixel PX1, the second subpixel PX2, and the third subpixel PX3, respectively. The first, second, and third light emitting elements 410, 420, and 430 may be electrically connected to separate thin film transistors 280 and may be driven independently.

The first, second and third light emitting elements 410, 420, and 430 may be configured to each independently emit light of a red wavelength spectrum, a green wavelength spectrum, a blue wavelength spectrum, an infrared wavelength spectrum, or any combination thereof. For example, the first light emitting element 410 may be configured to emit light of a red wavelength spectrum, the second light emitting element 420 may be configured to emit light of a green wavelength spectrum, and the third light emitting element 430 may emit light of a blue wavelength spectrum. Herein, the red wavelength spectrum, the green wavelength spectrum, and the blue wavelength spectrum may have a maximum emission wavelength ($\lambda_{max}$) in a wavelength region of greater than about 600 nm and less than about 750 nm, about 500 nm to about 600 nm, and greater than or equal to about 400 nm and less than about 500 nm, respectively.

The first, second, and third light emitting elements 410, 420, 430 may be, for example, light emitting diodes, for example, an organic light emitting diode including an organic material, an inorganic light emitting diode including an inorganic material, a quantum dot light emitting diode including quantum dots, or a perovskite light emitting diode including perovskite.

The sensor 100 may be formed on the substrate 200 (or the thin film transistor substrate), and may be randomly or regularly arranged along the plane direction (e.g., xy direction) of the substrate 200. As described above, the sensor 100 may be disposed in the non-display area NDA, and may be connected to a separate thin film transistor 280 to be independently driven. The sensor 100 may be configured to absorb light of the same wavelength spectrum as the light emitted from at least one of the first, second, or third light emitting elements 410, 420, and 430 to convert it into an electrical signal. For example, the sensor 100 may be configured to absorb light of a red wavelength spectrum, a green wavelength spectrum, a blue wavelength spectrum, or any combination thereof to convert it into an electrical signal. The sensor 100 may be, for example, a photoelectric conversion diode.

Each of the first, second, and third light emitting elements 410, 420, and 430 and the sensor 100 may include separate, respective pixel electrodes 411, 421, 431, and 110; a separate portion of a common electrode 120 facing the pixel electrodes 411, 421, 431, and 110 and to which a common voltage is applied; and separate, respective light emitting layers 412, 422, and 432 or a photoelectric conversion layer 130, a separate portion of a first common auxiliary layer 140, and a separate portion of a second common auxiliary layer 150 between the pixel electrodes 411, 421, 431, and 110 and the common electrode 120. The pixel electrode 110 of the sensor 100 may correspond to the first electrode 110 of the aforementioned sensor 100, the common electrode 120 of the sensor 100 may correspond to the second electrode 120 of the aforementioned sensor 100, and the first and second common auxiliary layers 140 and 150 may correspond to the first and second auxiliary layers 140 and 150 of the aforementioned sensor 100.

The first, second, and third light emitting elements 410, 420, and 430 and the sensor 100 may be arranged in parallel along the plane direction (e.g., xy direction) of the substrate 200, and the common electrode 120, the first common auxiliary layer 140, and the second common auxiliary layer 150 which are formed on the whole surface may be shared. For example, as shown in at least FIG. 13, the photoelectric conversion layer 130 of the sensor 100 and the light emitting layers 412, 422, and 432 of the first, second, and third light emitting elements 410, 420, and 430 may at least partially overlap with each other (e.g., partially or completely overlap each other) in the in-plane direction (e.g., xy direction) of the substrate 200, which may be understood to be a horizontal direction that extends in parallel to an in-plane direction of the substrate 200 as shown in FIG. 13 and/or a horizontal direction that extends in parallel to an upper surface 200s of the substrate 200 as shown in FIG. 13, and the photoelectric conversion layer 130 and the light emitting layers 412, 422, and 432 may be at least partially positioned on the same plane (e.g., an xy plane extending in the xy directions that intersects each of the photoelectric conversion layer 130 and the light emitting layers 412, 422, and 432).

The common electrode 120 is continuously formed as a single piece of material that extends on the light emitting layers 412, 422, and 432 and the photoelectric conversion layer 130, and is substantially formed on the whole surface of the substrate 200. The common electrode 120 may apply a common voltage to the first, second, and third light emitting elements 410, 420, and 430 and the sensor 100. As shown, the first, second, and third light emitting elements 410, 420, and 430 and the sensor 100 may include separate portions of a single common electrode 120 that is a single piece of material that extends on each of the respective light emitting layers 412, 422, and 432 and the photoelectric conversion layer 130 and between the first, second, and third light emitting elements 410, 420, and 430 and the sensor 100.

The first common auxiliary layer 140 is between the pixel electrodes 411, 421, 431, and 110 and the light emitting layers 412, 422, 432, and the photoelectric conversion layer 130, and may be continuously formed as a single piece of material that extends on the pixel electrodes 411, 421, 431, and 110, and under the light emitting layers 412, 422, and 432 and the photoelectric conversion layer 130. As shown, the first, second, and third light emitting elements 410, 420, and 430 and the sensor 100 may include separate portions of a single first common auxiliary layer 140 that is a single piece of material that extends on each of the respective light emitting layers 412, 422, and 432 and the photoelectric conversion layer 130 and between the first, second, and third light emitting elements 410, 420, and 430 and the sensor 100.

The first common auxiliary layer 140 may be a charge auxiliary layer (e.g., hole auxiliary layer) that facilitates injection and/or movement of charge carriers (e.g., holes) from the pixel electrodes 411, 421, and 431 to the light emitting layers 412, 422, and 432

For example, the HOMO energy level of the first common auxiliary layer 140 may be disposed between the HOMO energy level of the light emitting layers 412, 422, and 432 and the work function of the pixel electrodes 411, 421, 431. The work function of the pixel electrodes 411, 421, and 431, the HOMO energy level of the first common auxiliary layer 140, and the HOMO energy level of the light emitting layers 412, 422, and 432 may be sequentially deepened. On the other hand, the LUMO energy level of the first common auxiliary layer 140 may be shallower than the LUMO energy level of the photoelectric conversion layer 130 and the work function of the pixel electrode 110, respectively.

The first common auxiliary layer 140 may include an organic material, an inorganic material, an organic-inorganic material, or any combination thereof satisfying the HOMO energy level, for example a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-[tris(3-methylphenyl)phenylamino]triphenylamine), TDATA (4,4'4"-tris(N,N-diphenylamino)triphenylamine), 2-TNATA (4,4',4"-tris{N,N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-1-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h] quinoxaline-2,3,6,7,10,11-hexacarbonitrile), a carbazole-based derivative such as N-phenylcarbazole, polyvinylcarbazole, and the like, a fluorene-based derivative, TPD (N,N'-bis(3-methylphenyl)-N,N'-diphenyl-[1,1-biphenyl]-4,4'-diamine), a triphenylamine-based derivative such as TCTA (4,4',4"-tris(N-carbazolyl)triphenylamine), NPB (N,N'-di(naphthalene-I-yl)-N,N'-diphenylbenzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto. The first common auxiliary layer 140 may be one layer or two or more layers.

The second common auxiliary layer 150 may be between the light emitting layers 412, 422, and 432 and the photoelectric conversion layer 130, and the common electrode 120. The second common auxiliary layer 150 may be continuously formed as a single piece of material that extends on the light emitting layers 412, 422, and 432, and the photoelectric conversion layer 130, and under the common electrode 120. As shown, the first, second, and third light emitting elements 410, 420, and 430 and the sensor 100 may include separate portions of a single second common auxiliary layer 150 that is a single piece of material that extends under each of the respective light emitting layers 412, 422, and 432 and the photoelectric conversion layer 130 and between the first, second, and third light emitting elements 410, 420, and 430 and the sensor 100.

The second common auxiliary layer 150 may be a charge auxiliary layer (e.g., an electron auxiliary layer) that facilitates injection and/or movement of charge carriers (e.g., electrons) from the common electrode 120 to the light emitting layers 412, 422, and 432. For example, the LUMO energy level of the second common auxiliary layer 150 may be located between the LUMO energy level of the light emitting layers 412, 422, and 432 and the work function of the common electrode 120. The work function of the common electrode 120, the LUMO energy level of the second common auxiliary layer 150, and the LUMO energy level of the light emitting layers 412, 422, and 432 may become shallow in sequence.

The second common auxiliary layer 150 may include an organic material, an inorganic material, an organic-inorganic material, or any combination thereof satisfying the LUMO energy level, for example a halogenated metal such as LiF, NaCl, CsF, RbCl, and RbI; a lanthanides metal such as Yb; a metal oxide such as $Li_2O$ or BaO; Liq (lithium quinolate), Alq3 (tris[(8-hydroxyquinolinato)aluminum), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), Balq (bis(2-methyl-8-quinolinolato-N1,O8)-(1, 1'-biphenyl-4-olato)aluminum), $Bebq_2$ (beryllium bis (benzoquinolin-10-olate), ADN (9,10-di(naphthalene-2-yl) anthracene), BmPyPhB (1,3-bis[3,5-di(pyridin-3-yl)phenyl] benzene), or any combination thereof, but is not limited thereto. The first common auxiliary layer 140 may be one layer or two or more layers.

Each of the first, second, and third light emitting elements 410, 420, and 430 and the sensor 100 may include a separate pixel electrode 411, 421, 431, or 110 facing the common electrode 120. One of the pixel electrodes 411, 421, 431, or 110 and the common electrode 120 is an anode and the other is a cathode. For example, the pixel electrodes 411, 421, 431, and 110 may be an anode and the common electrode 120 may be a cathode. The pixel electrodes 411, 421, 431, and 110 are separated for each subpixel PX, and may be electrically connected to a separate thin film transistor 280 to be independently driven.

The pixel electrodes 411, 421, 431, and 110 and the common electrode 120 may each be a light-transmitting electrode or a reflective electrode, and for example, at least one of the pixel electrodes 411, 421, 431, and 110 or the common electrode 120 may be a light-transmitting electrode. The light-transmitting electrode may include the aforementioned transparent conductive film.

For example, when the pixel electrodes 411, 421, 431, and 110 are light-transmitting electrodes and the common electrode 120 is a reflective electrode, the sensor-embedded display panel 1000a may be a bottom emission type display panel configured to emit light toward the substrate 200. For example, when the pixel electrodes 411, 421, 431, and 110 are reflective electrodes and the common electrode 120 are light-transmitting electrode, the sensor-embedded display panel 1000a may be a top emission type display panel configured to emit light toward the opposite side of the substrate 200. For example, when the pixel electrodes 411, 421, 431, and 110 and the common electrode 120 are light-transmitting electrodes, respectively, the sensor-embedded display panel 1000a may be a both side emission type display panel configured to emit light toward both the substrate 200 and the opposite side of the substrate 200.

For example, the pixel electrodes 411, 421, 431, and 110 may be reflective electrodes, and the common electrode 120 may be a light-transmitting electrode.

Each of the first, second, and third light emitting elements 410, 420, and 430 includes light emitting layers 412, 422, and 432 between the pixel electrodes 411, 421, and 431 and the common electrode 120. Each of the light emitting layer 412 included in the first light emitting element 410, the light emitting layer 422 included in the second light emitting element 420, and the light emitting layer 432 included in the third light emitting element 430 may be configured to emit light in the same or different wavelength spectra and may be configured to emit light in, for example a red wavelength spectrum, a green wavelength spectrum, a blue wavelength spectrum, an infrared wavelength spectrum, or any combination thereof.

For example, when the first light emitting element 410, the second light emitting element 420, and the third light emitting element 430 are a red light emitting elements, a green light emitting element, and a blue light emitting element, respectively, the light emitting layer 412 may be a red light emitting layer configured to emit light in a red wavelength spectrum, the light emitting layer 422 included in the second light emitting element 420 may be a green light emitting layer configured to emit light in a green wavelength spectrum, and the light emitting layer 432 included in the third light emitting element 430 may be a blue light emitting layer configured to emit light in a blue wavelength spectrum. Herein, the red wavelength spectrum, the green wavelength spectrum, and the blue wavelength spectrum may have a maximum emission wavelength in a wavelength region of greater than about 600 nm and less than about 750 nm, about 500 nm to about 600 nm, and greater than or equal to about 400 nm and less than about 500 nm, respectively.

For example, when at least one of the first light emitting element 410, the second light emitting element 420, or the third light emitting element 430 is a white light emitting element, the light emitting layer of the white light emitting element may be configured to emit light of a full visible light wavelength spectrum, for example, light in a wavelength spectrum of greater than or equal to about 380 nm and less than about 750 nm, about 400 nm to about 700 nm, or about 420 nm to about 700 nm.

The light emitting layers 412, 422, and 432 may include an organic light emitter, a quantum dot, a perovskite, or any combination thereof as a light emitter. For example, the light emitting layers 412, 422, and 432 may include an organic light emitter, and may include at least one host material and a fluorescent or phosphorescent dopant.

The organic light emitter may be, for example, perylene; rubrene; 4-(dicyanomethylene)-2-methyl-6-[p-(dimethylamino)styryl]-4H-pyran; coumarin or a derivative thereof; carbazole or a derivative thereof; TPBi (2,2',2"-(1,3,5-benzinetriyl)-tris(1-phenyl-1-H-benzimidazole); TBADN (2-t-butyl-9,10-di(naphth-2-yl)anthracene); AND (9,10-di(naphthalene-2-yl)anthracene); CBP (4,4'-bis(N-carbazolyl)-1,1'-biphenyl); TCTA (4,4',4"-tris(carbazol-9-yl)-triphenylamine); TPBi (1,3,5-tris(N-phenylbenzimidazol-2-yl)benzene); TBADN (3-tert-butyl-9,10-di(naphth-2-yl) anthracene); DSA (distyrylarylene); CDBP (4,4"-dimethylbiphenyl); MADN (2-methyl-9,10-bis(naphthalen-2-yl) anthracene); TCP (1,3,5-tris(carbazol-9-yl)benzene); Alq3 (tris(8-hydroxyquinolino)lithium); an organometallic compound including Pt, Os, Ti, Zr, Hf, Eu, Tb, Tm, Rh, Ru, Re, Be, Mg, Al, Ca, Mn, Co, Cu, Zn, Ga, Ge, Pd, Ag, and/or Au, a derivative thereof or any combination thereof, but is not limited thereto.

The quantum dot may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or any combination thereof. The Group II-IV semiconductor compound may be, for example, selected from a binary element semiconductor compound selected from CdSe, CdTe, ZnS, ZnSe, ZnTe, ZnO, HgS, HgSe, HgTe, MgSe, MgS, or a mixture thereof; a ternary element semiconductor compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; and a quaternary element semiconductor compound selected from HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof, but is not limited thereto. The Group III-V semiconductor compound may be, for example, selected from a binary element semiconductor compound selected from GaN, GaP, GaAs, GaSb, AlN, AlP, AlAs, AlSb, InN, InP, InAs, InSb, or a mixture thereof; a ternary element semiconductor compound selected from GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; and a quaternary element semiconductor compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof, but is not limited thereto. The Group IV-VI semiconductor compound may be, for example, selected from a binary element semiconductor compound selected from SnS, SnSe, SnTe, PbS, PbSe, PbTe, or a mixture thereof; a ternary element semiconductor compound selected from SnSeS, SnSeTe, SnSTe, PbSeS, PbSeTe, PbSTe, SnPbS, SnPbSe, SnPbTe, or a mixture thereof; and a quaternary element semiconductor compound selected from SnPbSSe, SnPbSeTe, SnPbSTe, or a mixture thereof, but is not limited thereto. The Group IV semiconductor compound may be, for example, selected from a single-element semiconductor compound such as Si, Ge, or a mixture thereof; and a binary element compound selected from SiC, SiGe, or a mixture thereof, but is not limited thereto. The Group I-III-VI semiconductor compound may be, for example, $CuInSe_2$, $CuInS_2$, CuInGaSe, CuInGaS, or a mixture thereof, but is not limited thereto. The Group 1-II-IV-VI semiconductor compound may be, for example, CuZnSnSe, CuZnSnS, or a mixture thereof, but is not limited thereto. The Group II-III-V semiconductor compound may be, for example, InZnP, but is not limited thereto.

The perovskite may be $CH_3NH_3PbBr_3$, $CH_3NH_3PbI_3$, $CH_3NH_3SnBr_3$, $CH_3NH_3SnI_3$, $CH_3NH_3Sn_{1-x}Pb_xBr_3$, $CH_3NH_3Sn_{1-x}Pb_xI_3$, $HC(NH_2)_2PbI_3$, $HC(NH_2)_2SnI_3$, $(C_4H_9NH_3)_2PbBr_4$, $(C_6H_5CH_2NH_3)_2PbBr_4$, $(C_6H_5CH_2NH_3)_2PbI_4$, $(C_6H_5C_2H_4NH_3)_2PbBr_4$, $(C_6H_{13}NH_3)_2(CH_3NH_3)_{n1}Pb_nI_{3n+1}$ (x, n, 1x, and n1 being any positive integer), or any combination thereof, but is not limited thereto.

The sensor 100 includes a photoelectric conversion layer 130 between the pixel electrode 110 and the common electrode 120. The photoelectric conversion layer 130 is disposed in parallel with the light emitting layers 412, 422, and 432 of the first, second, and third light emitting elements 410, 420, and 430 along the plane direction (e.g., xy direction) of the substrate 200. The photoelectric conversion layer 130 and the light emitting layers 412, 422, and 432 may be disposed on the same plane.

The photoelectric conversion layer 130 may be configured to absorb light of a particular (or, alternatively, predetermined) wavelength spectrum and convert the absorbed light into an electrical signal. The photoelectric conversion layer 130 may be configured to absorb light emitted from at least one of the first, second, or third light emitting elements 410, 420, or 430 and then reflected by the recognition target 40, and convert the absorbed light into an electrical signal. The photoelectric conversion layer 130 may be configured to absorb light of a red wavelength spectrum, a green wavelength spectrum, a blue wavelength spectrum, an infrared wavelength spectrum, or any combination thereof.

For example, the photoelectric conversion layer 130 may be configured to selectively absorb light of a red wavelength spectrum having a maximum absorption wavelength belonging to greater than about 600 nm and less than about 750 nm, and may be configured to absorb light generated from the red light emitting element among the first, second, and third light emitting elements 410, 420, and 430 and then reflected by the recognition target 40.

For example, the photoelectric conversion layer 130 may be configured to selectively absorb light of a green wavelength spectrum having a maximum absorption wavelength belonging to about 500 nm to about 600 nm, and may be configured to absorb light generated from the green light emitting element among the first, second, and third light emitting elements 410, 420, and 430 and then reflected by the recognition target 40.

For example, the photoelectric conversion layer 130 may be configured to selectively absorb light in a blue wavelength spectrum having a maximum absorption wavelength belonging to greater than or equal to about 380 nm and less than about 500 nm, and may be configured to absorb light generated from the blue light emitting element among the first, second, and third light emitting elements 410, 420, and 430 and then reflected by the recognition target 40.

For example, the photoelectric conversion layer 130 may be configured to absorb light of a red wavelength spectrum, a green wavelength spectrum, and a blue wavelength spectrum, that is, light of a full visible wavelength spectrum of greater than or equal to about 380 nm and less than about 750 nm. The photoelectric conversion layer 130 may be configured to absorb light generated from the first, second, and third light emitting elements 410, 420, and 430 and then reflected by the recognition target 40.

A detailed description of the photoelectric conversion layer 130 is the same as described above.

The thickness of the light emitting layers 412, 422, and 432 and the thickness of the photoelectric conversion layer 130 may each independently be about 5 nm to about 300 nm, and within the above range, about 10 nm to about 250 nm, about 20 nm to about 200 nm, or about 30 nm to about 180 nm. A difference in thickness between the light emitting layers 412, 422, and 432 and the photoelectric conversion layer 130 may be less than or equal to about 20 nm, and within the above range, less than or equal to about 15 nm, less than or equal to about 10 nm, or less than or equal to about 5 nm, and the light emitting layers 412, 422, and 432 and the photoelectric conversion layer 130 may have substantially the same thickness.

An encapsulation layer 380 is formed on the first, second, and third light emitting elements 410, 420, 430, and the sensor 100. The encapsulation layer 380 may include, for example, a glass plate, a metal thin film, an organic layer, an inorganic layer, an organic-inorganic layer, or any combination thereof. The organic film may include, for example, an acrylic resin, a (meth)acrylic resin, polyisoprene, a vinyl resin, an epoxy resin, a urethane resin, a cellulose resin, a perylene resin, or any combination thereof, but is not limited thereto. The inorganic film may include, for example, an oxides, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or any combination thereof, but is not limited thereto. The organic-inorganic film may include, for example, polyorganosiloxane, but is not limited thereto. The encapsulation layer 380 may be one layer or two or more layers.

As described above, the sensor-embedded display panel 1000*a* according to some example embodiments includes the first, second, and third light emitting elements 410, 420, and 430 configured to emit light of a particular (or, alternatively, predetermined) wavelength spectrum to display colors, and the sensor 100 configured to absorb light generated by reflection of the light, by the recognition target 40 and convert it into an electrical signal, in the same plane on the substrate 200, thereby performing a display function and a recognition function (e.g., biometric recognition function) together. Accordingly, unlike conventional display panels formed on the outside of the display panel or formed under the display panel by manufacturing the sensor as a separate module, it may improve performance without increasing the thickness, implementing a slim-type high performance sensor-embedded display panel 1000*a*.

In addition, the sensor 100 uses light emitted from the first, second, and third light emitting elements 410, 420, and 430 and may conduct a recognition function (e.g., a biometric recognition function) without a separate light source. Accordingly, since the separate light source does not need to be equipped outside the display panel, the display panel may be prevented from deterioration of an aperture ratio due to an area occupied by the light source, and simultaneously, since electric power consumed by the separate light source may be saved, power consumption of the sensor-embedded display panel 1000*a* may be improved.

In addition, as described above, the first, second, and third light emitting elements 410, 420, and 430 and the sensor 100 share the common electrode 120, the first common auxiliary layer 140, and the second common auxiliary layer 150 and thus the structure and process may be simplified compared with the case where the first, second, and third light emitting elements 410, 420, and 430 and the sensor 100 are formed in separate processes.

In FIG. 13, the sensor 100 is illustrated as being disposed between the second light emitting element 420 and third light emitting element 430, but it may be disposed between two light emitting elements selected from the first light emitting element 410, the second light emitting element 420, and the third light emitting element 430.

In addition, as described above, the sensor 100 may be disposed anywhere in the non-display area NDA, they may be disposed at a desired location of the sensor-embedded display panel 1000*a* as many as desired. Therefore, for example, by randomly or regularly arranging the sensor 100 over the entire sensor-embedded display panel 1000*a*, the biometric recognition function may be performed on any portion of the screen of an electronic device such as a mobile device and the biometric recognition function may be selectively performed only in a specific location where the biometric recognition function is required.

Hereinafter, another example of the sensor-embedded display panel according to some example embodiments is described.

Figure 14:
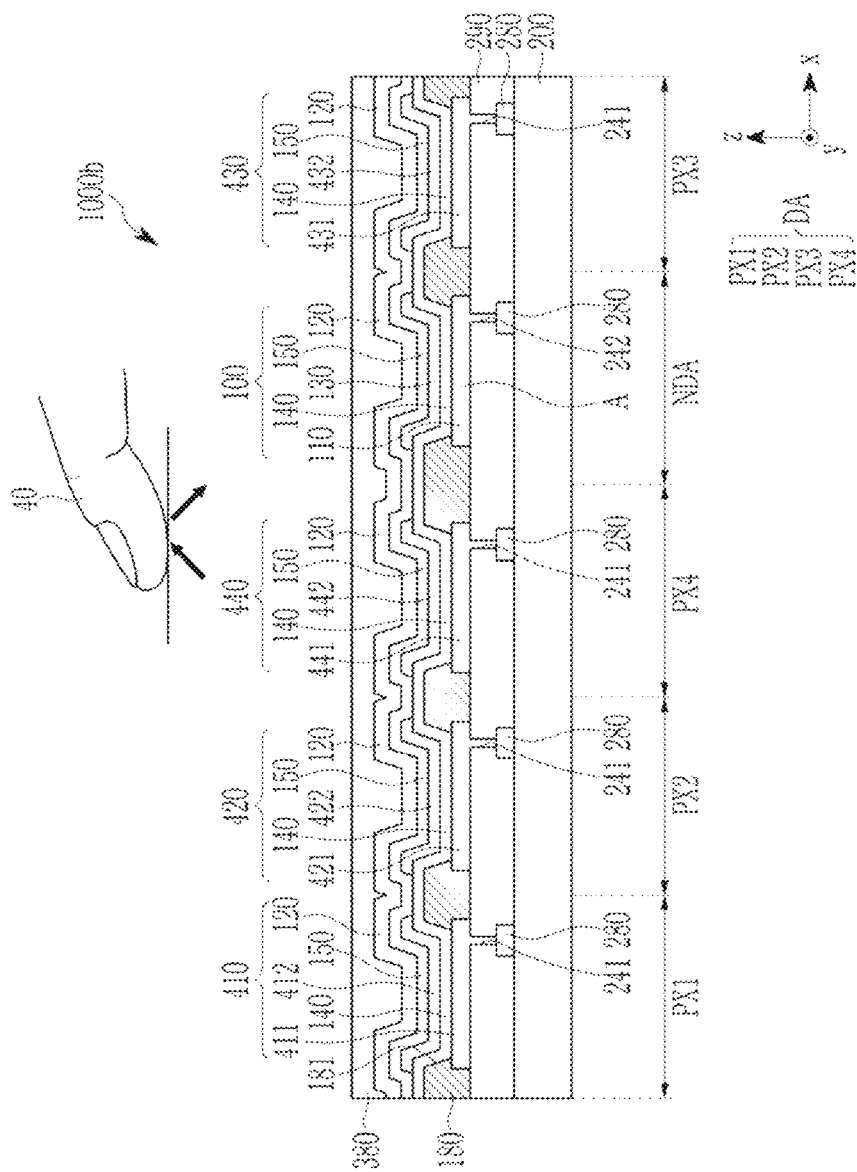
FIG. 14 is a cross-sectional view illustrating an example of a sensor-embedded display panel according to some example embodiments.

FIG. 14 is a cross-sectional view illustrating an example of a sensor-embedded display panel according to some example embodiments.

Referring to FIG. 14, a sensor-embedded display panel 1000*b* according to some example embodiments includes a plurality of subpixels PX configured to display different colors, that is, a first subpixel PX1, a second subpixel PX2, and a third subpixel PX3 configured to display a first color, a second color, or a third color selected from red, green, and blue, and the first subpixel PX1, the second subpixel PX2, and the third subpixel PX3 include a first light emitting element 410, a second light emitting element 420, and a third light emitting element 430, respectively, like some example embodiments, including the example embodiments illustrated in FIGS. 12 and 13.

However, unlike some example embodiments, including the example embodiments illustrated in FIGS. 12 and 13, the sensor-embedded display panel 1000*b* according to some example embodiments may include the fourth light emitting element 440 configured to emit light in an infrared wavelength spectrum. For example, the fourth light emitting element 440 may be included in the fourth subpixel PX4 adjacent to the first subpixel PX1, the second subpixel PX2, and/or the third subpixel PX3, or may be included in a non-display area, NDA. The fourth subpixel PX4 may form one unit pixel UP together with the first subpixel PX1, the second subpixel PX2, and the third subpixel PX3, and the unit pixel UP may be arranged repeatedly along rows and/or columns.

Descriptions of the first subpixel PX1, the second subpixel PX2, the third subpixel PX3, the first light emitting element 410, the second light emitting element 420, the third light emitting element 430, and the sensor 100 are the same as described above.

The fourth light emitting element 440 is disposed on the substrate 200 and may be disposed on the same plane as the first, second, and third light emitting elements 410, 420, and 430 and the sensor 100. The fourth light emitting element 440 may be electrically connected to a separate thin film transistor 280 and driven independently. The fourth light emitting element 440 may have a structure in which the pixel electrode 441, the first common auxiliary layer 140, the light emitting layer 442, the second common auxiliary layer 150, and the common electrode 120 are sequentially stacked. Among them, the common electrode 120, the first common auxiliary layer 140, and the second common auxiliary layer 150 may be shared with the first, second, and third light emitting elements 410, 420, and 430 and the sensor 100. The light emitting layer 442 may be configured to emit light of an infrared wavelength spectrum, which may have for example a maximum emission wavelength in greater than or equal to about 750 nm, about 750 nm to about 20 μm, about 780 nm to about 20 μm, about 800 nm to about 20 μm, about 750 nm to about 15 μm, about 780 nm to about 15 μm, about 800 nm to about 15 μm, about 750 nm to about 10 μm, about 780 nm to about 10 μm, about 800 nm to about 10 μm, about 750 nm to about 5 μm, about 780 nm to about 5 μm, about 800 nm to about 5 μm, about 750 nm to about 3 μm, about 780 nm to about 3 μm, about 800 nm to about 3 μm, about 750 nm to about 2 μm, about 780 nm to about 2 μm, about 800 nm to about 2 μm, about 750 nm to about 1.5 μm, about 780 nm to about 1.5 μm, or about 800 nm to about 1.5 μm.

The sensor 100 may be configured to absorb light generated from at least one of the first, second, third, or fourth light emitting elements 410, 420, 430, and 440 and then reflected by a recognition target 40 such as a living body or a tool, and convert the absorbed light into an electrical signal. For example, the sensor 100 may be configured to absorb light in and infrared wavelength spectrum generated from the fourth light emitting element 440 and then reflected by the recognition target 40, and convert the absorbed light into an electrical signal. In this case, the photoelectric conversion layer 130 of the sensor 100 may include an organic material, an inorganic material, an organic-inorganic material, or any combination thereof configured to selectively absorb light in the infrared wavelength spectrum. For example, the photoelectric conversion layer 130 may include a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a naphthoquinone, a diquinone compound, a naphthoquinone compound, an anthraquinone compound, a squarylium compound, a rylene compound, a perylene compound, a squaraine compound, a pyrylium compound, a squaraine compound, a thiopyrylium compound, a diketopyrrolopyrrole compound, a boron dipyrromethene compound, a nickel-dithiol complex compound, a croconium compound, a derivative thereof, or any combination thereof, but is not limited thereto.

The sensor-embedded display panel 1000b according to some example embodiments includes the fourth light emitting element 440 configured to emit light in the infrared wavelength spectrum and the sensor 100 configured to absorb light in the infrared wavelength spectrum. Therefore, in addition to the biometric detection function, the sensitivity of the sensor 100 may be improved even in a low-illumination environment, and the detection capability of a 3D image may be further increased by widening a dynamic range for detailed division of black and white contrast. Accordingly, the sensing capability of the sensor-embedded display panel 1000b may be further improved. In particular, since light in the infrared wavelength spectrum may have a deeper penetration depth due to its long wavelength characteristics and information located at different depths may be effectively obtained, images or changes in blood vessels such as veins, iris and/or face, etc., in addition to fingerprints may be effectively detected, and the scope of application nay be further expanded.

In FIG. 14, the sensor 100 is illustrated as being disposed between the fourth light emitting element 440 and the third light emitting element 430, but it may be disposed between two light emitting elements selected from the first light emitting element 410, the second light emitting element 420, the third light emitting element 430, and the fourth light emitting elements 440.

In some example embodiments, the sensor 100 may be provided separately from (e.g., independently of) a sensor-embedded display panel 1000 and/or from any light emitting elements, for example as a separate component of an electronic device. For example, an electronic device, such as the electronic device 2000 shown in FIG. 16, may include a plurality of sensors 100, as a separate at least one additional device 1340, to serve as a camera for the electronic device separately from any light emitting elements and/or display panels of the electronic device 2000.

In some example embodiments, one or both of the first common auxiliary layer 140 and/or the second common auxiliary layer 150 may be absent from the sensor-embedded display panel 1000, and the photoelectric conversion layer 130 of the sensor 100 may be understood to be between (e.g., directly between) a pair of electrodes (e.g., pixel electrode 110 and a portion of the common electrode 120). In some example embodiments, the common electrode 120 may be replaced by a plurality of separate pixel electrodes that are each included in a separate one of the light emitting elements 410, 420, 430, and/or 440 and/or the sensor 100 and may face a separate pixel electrode 411, 421, 431, and/or 110, such that the photoelectric conversion layer 130 of the sensor 100 may be understood to be between (e.g., directly between) a pair of electrodes that include the pixel electrode 110 and a separate electrode included in the sensor 100.

The aforementioned sensor-embedded display panels 1000a and 1000b may be applied to (e.g., included in) electronic devices such as various display devices. Electronic devices such as display devices may be applied to, for example, mobile phones, video phones, smart phones, mobile phones, smart pads, smart watches, digital cameras, tablet PCs, laptop PCs, notebook computers, computer monitors, wearable computers, televisions, digital broadcasting terminals, e-books, personal digital assistants (PDAs), portable multimedia player (PMP), enterprise digital assistant (EDA), head mounted display (HMD), vehicle navigation, Internet of Things (IoT), Internet of all things (IoE), drones, door locks, safes, automatic teller machines (ATM), security devices, medical devices, or automotive electronic components, but are not limited thereto.

Figure 15:
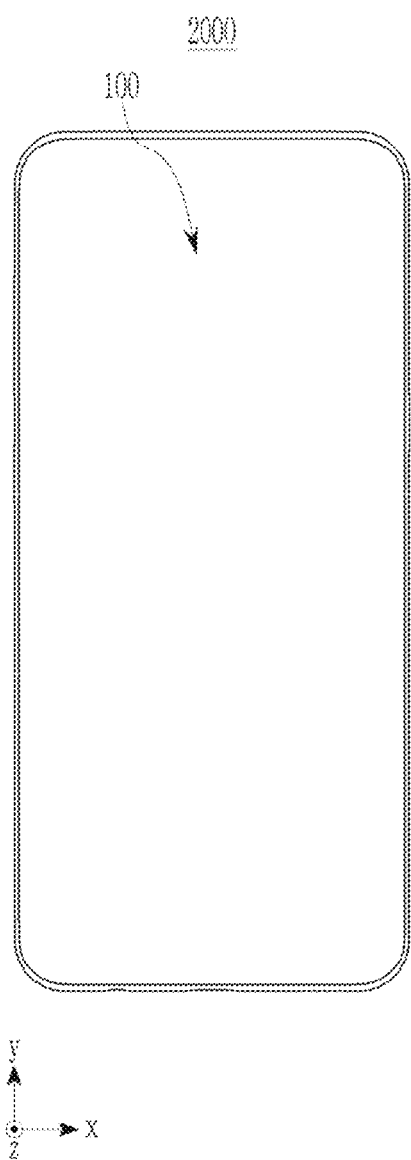
FIG. 15 is a schematic diagram illustrating a smart phone as an electronic device according to some example embodiments.

FIG. 15 is a schematic view illustrating an example of a smart phone as an electronic device according to some example embodiments.

Referring to FIG. 15, the electronic device 2000 may include the aforementioned sensor-embedded display panel 1000, the sensor-embedded display panel 1000 having the sensor 100 disposed on the whole or a part of the area of the sensor-embedded display panel 1000, and thus a biometric recognition function may be performed on any part of the screen, and according to the user's selection, the biometric recognition function may be selectively performed only at a specific location where the biometric recognition function is required.

An example of a method of recognizing the recognition target 40 in an electronic device 2000 such as a display device may include, for example, driving the first, second, and third light emitting elements 410, 420, and 430 of the sensor-embedded display panel 1000 (or the first, second, third, and fourth light emitting elements 410, 420, 430, and 440) and the sensor 100 to detect the light reflected from the recognition target 40 among the light emitted from the first, second, and third light emitting elements 410, 420, and 430 (or the first, second, third and fourth light emitting elements 410, 420, 430, and 440), in the sensor 100; comparing the image of the recognition target 40 stored in advance with the image of the recognition target 40 detected by the sensor 100; and judging the consistency of the compared images and if they match according to the determination that recognition of the recognition target 40 is complete, turning off the sensor 100, permitting user's access to the display device, and driving the sensor-embedded display panel 1000 to display an image.

Figure 16:
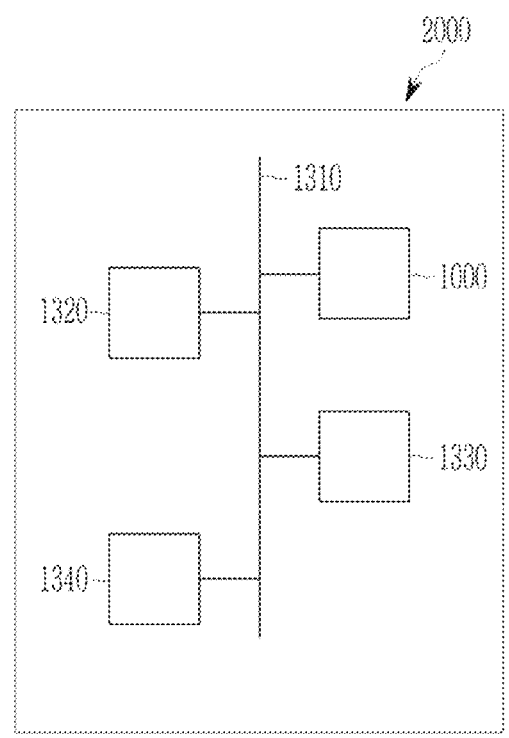
FIG. 16 is a schematic diagram illustrating a configuration diagram of an electronic device according to some example embodiments.

FIG. 16 is a schematic view illustrating an example of a configuration diagram of an electronic device according to some example embodiments.

Referring to FIG. 16, in addition to the aforementioned constituent elements (e.g., the sensor-embedded display panel 1000), the electronic device 2000 may further include a bus 1310, a processor 1320, a memory 1330, and at least one additional device 1340. Information of the aforementioned sensor-embedded display panel 1000, processor 1320, memory 1330, and at least one additional device 1340 may be transmitted to each other through the bus 1310. In some example embodiments, the at least one additional device 1340 may be omitted. In some example embodiments, the sensor-embedded display panel 1000 may be replaced by a display device including, for example, exclusively light emitting elements and no light absorption sensors, while the at least one additional device 1340 may include one or a plurality (e.g., an array) of sensors (e.g., one or more sensors 100) according to any of the example embodiments which may serve as a biometric sensor, a camera, or the like.

The processor 1320 may include one or more articles (e.g., units, instances, etc.) of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. As an example, the processing circuitry may include a non-transitory computer readable storage device. The processor 1320 may control, for example, a display operation of the sensor-embedded display panel 1000 or a sensor operation of the sensor 100.

The memory 1330 may be a non-transitory computer readable storage medium, such as, for example, as a solid state drive (SSD) and may store an instruction program (e.g., program of instructions), and the processor 1320 may perform a function related to the sensor-embedded display panel 1000 by executing the stored instruction program.

The at least one additional device 1340 may include one or more communication interfaces (e.g., wireless communication interfaces, wired interfaces), user interfaces (e.g., keyboard, mouse, buttons, etc.), power supply and/or power supply interfaces, or any combination thereof.

The units and/or modules described herein may be implemented using hardware constituent elements and software constituent elements. The units and/or modules described herein may include, may be included in, and/or may be implemented by one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. For example, the hardware constituent elements may include microphones, amplifiers, band pass filters, audio-to-digital converters, and processing devices. The processing device may be implemented using one or more hardware devices configured to perform and/or execute program code by performing arithmetic, logic, and input/output operations. The processing device may include a processor, a controller and an arithmetic logic unit, a digital signal processor, a microcomputer, a field programmable array, a programmable logic unit, a microprocessor, or any other device capable of responding to and executing instructions. The processing device may access, store, operate, process, and generate data in response to execution of an operating system (OS) and one or more software running on the operating system.

The software may include a computer program, a code, an instruction, or any combination thereof, and may transform a processing device for a special purpose by instructing and/or configuring the processing device independently or collectively to operate as desired. The software and data may be implemented permanently or temporarily as signal waves capable of providing or interpreting instructions or data to machines, parts, physical or virtual equipment, computer storage media or devices, or processing devices. The software may also be distributed over networked computer systems so that the software may be stored and executed in a distributed manner. The software and data may be stored by one or more non-transitory computer readable storage devices.

The method according to the foregoing example embodiments may be recorded in a non-transitory computer readable storage device including program instructions for implementing various operations of the aforementioned example embodiments. The storage device may also include program instructions, data files, data structures, and the like alone or in combination. The program instructions recorded in the storage device may be specially designed for some example embodiments or may be known to those skilled in computer software and available for use. Examples of non-transitory computer-readable storage devices may include magnetic media such as hard disks, floppy disks, and magnetic tapes; optical media such as CD-ROM discs, DVDs and/or blue-ray discs; magneto-optical media such as optical disks; and a hardware device configured to store and execute program instructions such as ROM, RAM, flash memory, and the like. The aforementioned device may be configured to operate as one or more software modules to perform the operations of the aforementioned example embodiments.

Hereinafter, some example embodiments are illustrated in more detail with reference to examples. However the present scope of the inventive concepts are not limited to these examples.

EXAMPLES

Example 1-1: Manufacture of Transparent Conductive Film

Copper with purity of 99.999% is deposited on an $SiO_2$ substrate (300 nm) at 25° C. under $2.5 \times 10^{-6}$ torr to form a 2 nm-thick copper layer. The copper layer is exposed to hydrogen sulfide ($H_2S$) gas for 20 seconds at room temperature under a normal pressure, forming a film including a CuS nano structure. The corresponding CuS film is annealed at 150° C./$8.0 \times 10^{-4}$ torr for 1 hour. Subsequently, the film is allowed to stand for 30 seconds under a gas atmosphere generated by gasifying iodine solids on a hot plate at 30° C. for 30 seconds, preparing a transparent conductive film, Example 1-2: Manufacture of Transparent Conductive Film A transparent conductive film is prepared in the same manner as in Example 1-1 except that the copper layer is formed to have a thickness of 5 nm.

Example 1-3: Manufacture of Transparent Conductive Film

A transparent conductive film is prepared in the same manner as in Example 1-1 except that the copper layer is formed to have a thickness of 10 nm.

Example 1-4: Manufacture of Transparent Conductive Film

A transparent conductive film is prepared in the same manner as in Example 1-1 except that the copper layer is formed to have a thickness of 20 nm.

Example 1-5: Manufacture of Transparent Conductive Film

The transparent conductive film according to Example 1-1 is heat-treated at 150° C. for 1 hour.

Example 2-1: Manufacture of Thin Film Transistor

Example 2-1a

An $MoS_2$ monolayer (0.7 nm) is formed on a silicon wafer substrate covered with $SiO_2$ (3000 Å) in a chemical vapor deposition (CVD) method.

Example 2-1b

Separately, another silicon wafer substrate covered with $SiO_2$ (3000 Å) is prepared into a size of $1.5 \times 1.5$ cm$^2$, and a source and drain electrode pattern (hereinafter, referred to as an electrode pattern) is formed thereon by using photolithography. On the formed electrode pattern, copper with purity of 99.999% is thermally deposited at 25° C. under $7.0 \times 10^{-7}$ torr to form a 5 nm-thick copper layer. The electrode pattern having the copper layer is lifted off, forming a source electrode and a drain electrode formed of the copper.

After preparing 1 ml of a sulfide ammonium (($NH_4)_2S$) solution, the prepared copper electrode is placed on top of this sulfide ammonium solution. Then, the copper electrode is exposed to hydrogen sulfide ($H_2S$) gas generated from the solution for 20 seconds, forming a source electrode and drain electrode including CuS.

The source electrode and drain electrode including CuS (hereinafter, referred to as a CuS electrode) is heat-treated at 150° C. under $8.0 \times 10^{-4}$ torr for 1 hour. While iodine solids are vaporized on a hot plate (30° C.), the CuS electrode is placed thereon and exposed thereto for 30 seconds, forming an iodine-doped CuS electrode.

The iodine-doped CuS electrode is transferred onto cleaned HfO, and the $MoS_2$ monolayer of Example 2-1a is transferred to form a transistor.

Example 2-2: Manufacture of Thin Film Transistor

A thin film transistor is manufactured in the same manner as in Example 2-1 except that the exposure time of the CuS electrode is changed into 6 minutes.

Example 2-3: Manufacture of Thin Film Transistor

A thin film transistor is manufactured in the same manner as in Example 2-1 except that the thickness of the copper layer was changed into 10 nm.

Example 2-4: Manufacture of Thin Film Transistor

A thin film transistor is manufactured in the same manner as in Example 2-1 except that the thickness of the copper layer is changed into 20 nm.

Example 2-5: Manufacture of Thin Film Transistor

The thin film transistor according to Example 2-1 is heat-treated at 150° C. for 1 hour.

Comparative Example 2-1: Manufacture of Thin Film Transistor

A silicon wafer substrate covered with $SiO_2$ (3000 Å) is prepared into a size of $1.5 \times 1.5$ cm$^2$ and then, treated through photolithography, forming a source and drain electrode pattern (hereinafter, referred to as an electrode pattern). On the formed electrode pattern, copper with purity of 99.999% is thermally depositing at 25° C. under $7.0 \times 10^{-7}$ torr, forming a 5 nm-thick copper layer. The electrode pattern having the copper layer is lifted off, obtaining a source electrode and a drain electrode formed of the copper.

After preparing 1 ml of an ammonium sulfide (($NH_4)_2S$) solution, the prepared copper electrode is placed thereon. The copper electrode is exposed to hydrogen sulfide ($H_2S$) gas generated from the solution for 20 seconds or so, forming a source electrode and drain electrode including CuS.

The CuS electrode is transferred onto cleaned HfO, and the prepared $MoS_2$ monolayer according to Example 2-1a is transferred thereto, manufacturing a transistor.

Evaluation 1: Confirmation of Doping of Transparent Conductive Film

Figure 17:
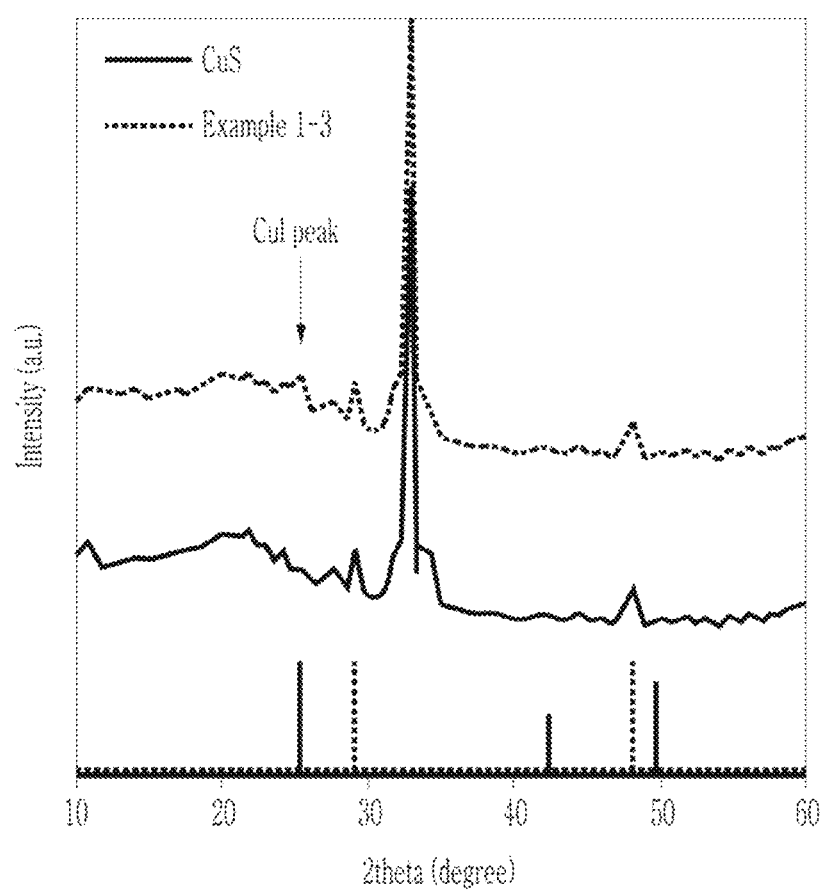
FIG. 17 is a graph showing the results of X-ray diffraction analysis before and after iodine doping of the transparent conductive film according to Example 1-3.

An X-ray diffraction analysis of the transparent conductive film according to Example 1-3 is performed before and after the iodine doping, and the results are shown in FIG. 17. FIG. 17 is a graph showing the results of X-ray diffraction analysis before and after the iodine doping of the transparent conductive film according to Example 1-3. Referring to FIG. 17, in the X-ray diffraction analysis graph after the iodine doping, compared with the X-ray diffraction analysis graph before the iodine doping, a peak corresponding to CuI appears.

Evaluation 2: Light Transmittance

The transparent conductive films according to Examples 1-1 to 1-3 and a 130 nm-thick ITO film as a comparative example are measured with respect to light transmittance according to a wavelength by using a haze meter (Model name: Carry 5000, Manufacturer: Agilent Technologies, Inc.), and the results are shown in Table 1.

TABLE 1

| Wavelength (nm) | Light transmittance (%) | | | |
|---|---|---|---|---|
| | Example 1-1 | Example 1-2 | Example 1-3 | ITO (comparative example) |
| 550 | 94 | 88 | 82 | 75 |
| 1000 | 89 | 84 | 79 | 83 |
| 1500 | 88 | 81 | 72 | 60 |
| 2000 | 88 | 80 | 69 | 39 |
| 2500 | 86 | 78 | 63 | 20 |

Referring to Table 1, the transparent conductive films according to Examples 1-1 to 1-3 exhibit higher light transmittance than the ITO film.

Evaluation 3: Sheet Resistance of Transparent Conductive Film

Figure 18:
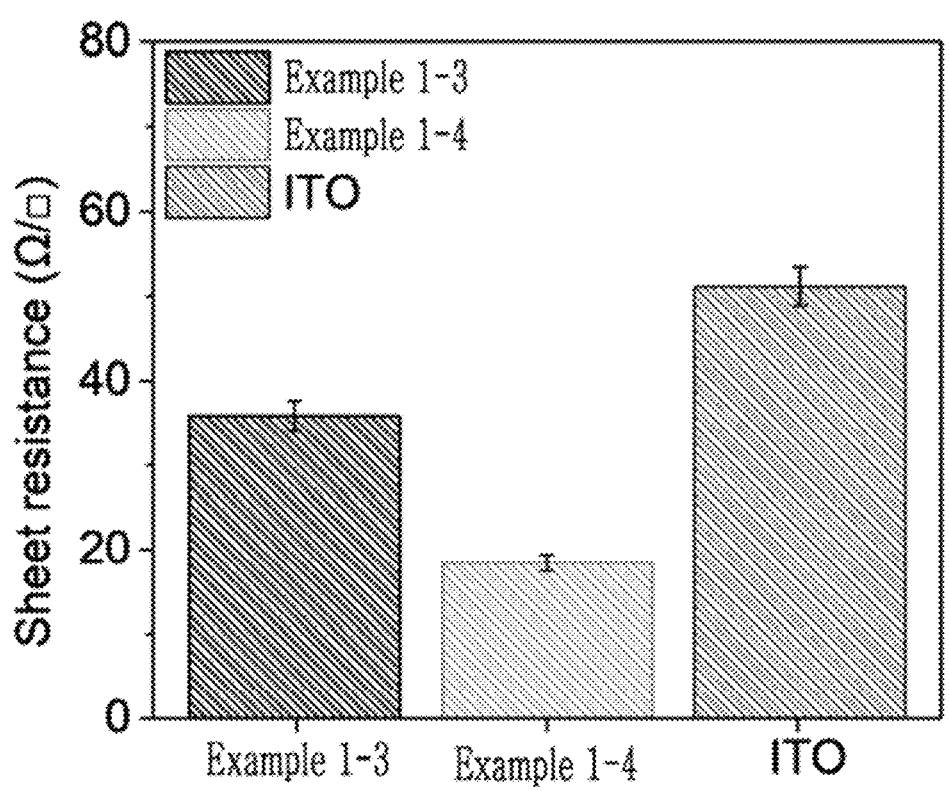
FIG. 18 is a graph showing the sheet resistance measurement results of the transparent conductive films according to Examples 1-3 and 1-4 according to some example embodiments.

The transparent conductive films according to Examples 1-3 and 1-4 and a 130 nm-thick ITO film as a comparative example are measured with respect to sheet resistance by using Keithley 4200A-SCS (Keithley Instruments, LLC), and the results are shown in FIG. 18.

FIG. 18 is a graph showing the sheet resistance measurement results of the transparent conductive films according to Examples 1-3 and 1-4 and the 130 nm-thick ITO film as a comparative example. Referring to FIG. 18, the transparent conductive films according to Examples 1-3 and 1-4 exhibit significantly low sheet resistance in relation to the ITO film.

Figure 19:
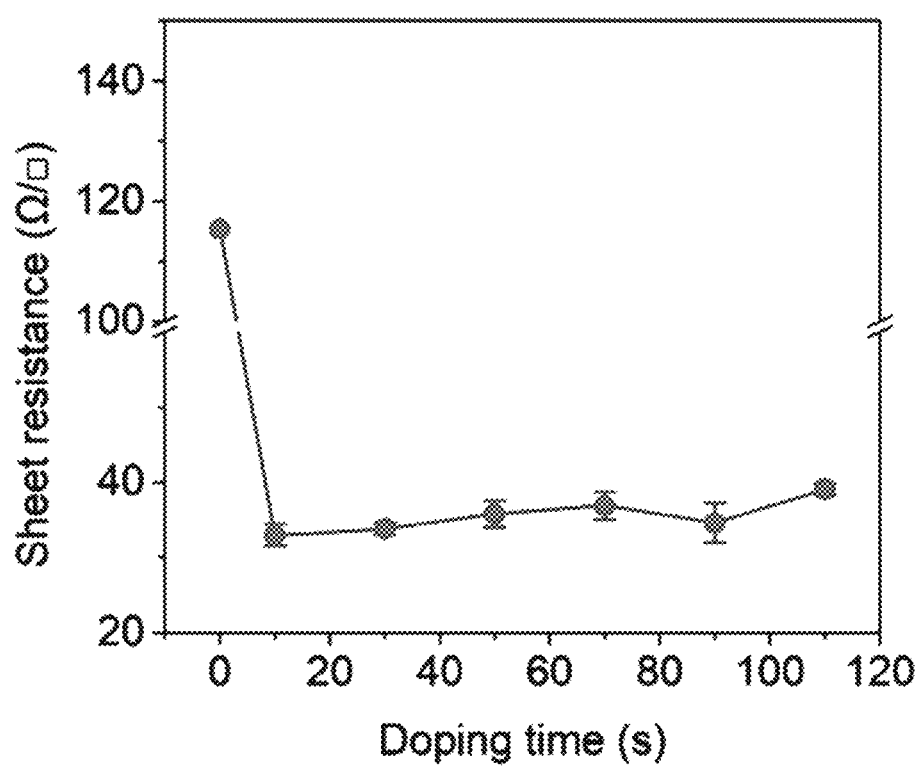
FIG. 19 is a graph showing the sheet resistance according to the doping treatment time of a film including a CuS nanostructure according to some example embodiments.

Evaluation 4: Sheet Resistance of Transparent Conductive Film According to Doping Time A transparent conductive film including a CuS nanostructure and doped with iodine is manufactured in the same manner as in Example 1-3 by using a 10 nm-thick film including the CuS nano structure but changing the exposure time to a gas atmosphere generated by gasifying iodine solids and then, measured with respect to sheet resistance by using Keithley 4200A-SCS (Keithley Instruments, LLC), and the results are shown in FIG. 19. FIG. 19 is a graph showing the sheet resistance according to the doping treatment time of the film including the CuS nanostructure. Referring to FIG. 19, the sheet resistance is significantly reduced after the doping compared with before the doping.

Evaluation 5: Reliability of Transparent Conductive Film

Figure 20:
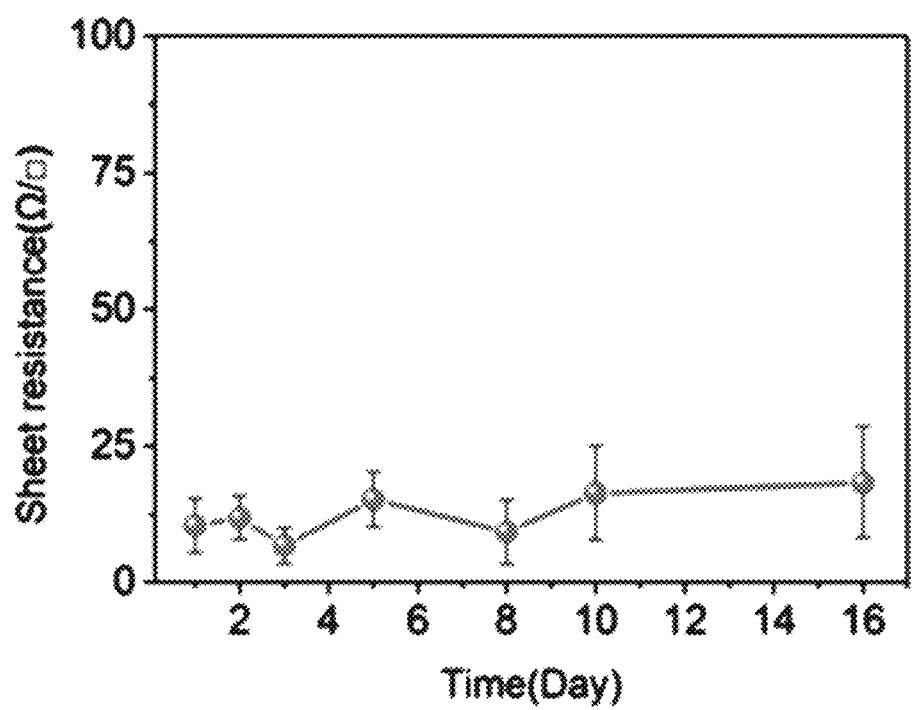
FIG. 20 is a graph showing the change in sheet resistance according to the storage time at room temperature of the transparent conductive film according to Examples 1-3 according to some example embodiments.

The transparent conductive film according to Example 1-3 is stored at room temperature for 16 days and then, measured with respect to sheet resistance by using Keithley 4200A-SCS (Keithley Instruments, LLC), and the results are shown in FIG. 20. FIG. 20 is a graph showing the change in sheet resistance according to the storage time at room temperature of the transparent conductive film according to Example 1-3. Referring to FIG. 20, the transparent conductive film according to Example 1-3 exhibits that the sheet resistance is not significantly changed over time.

Evaluation 6: Reliability of Transparent Conductive Film

Figure 21:
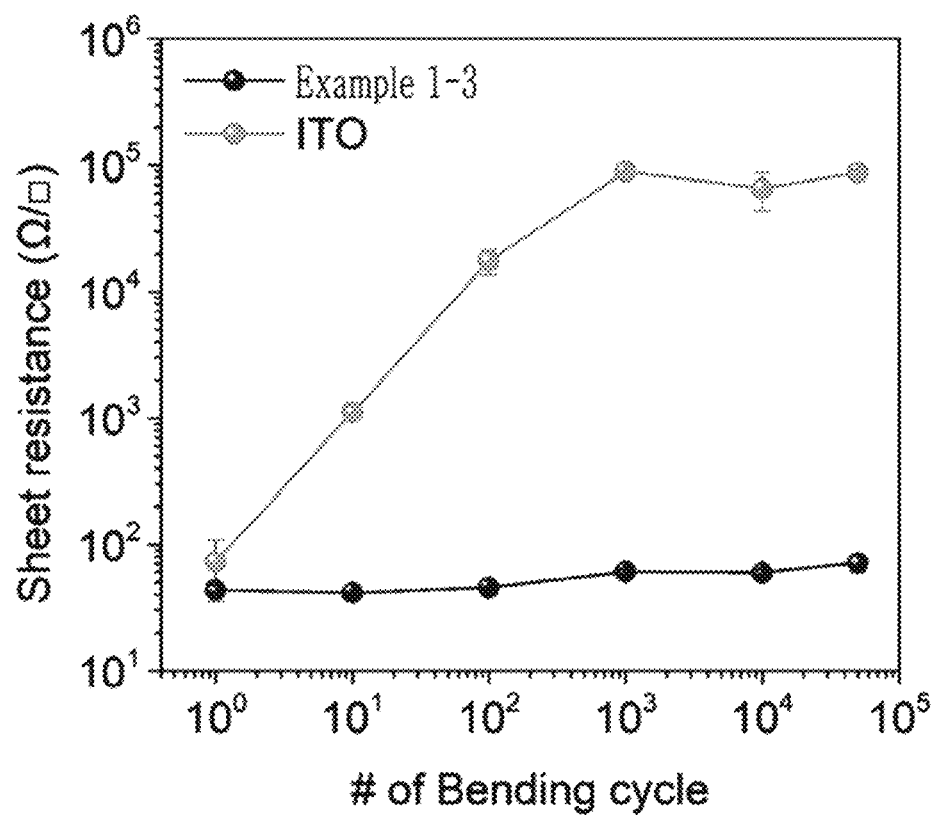
FIG. 21 is a graph showing the change in sheet resistance according to the number of repeated bending (radius of curvature (R): 4 mm) of the transparent conductive film and the ITO film according to Example 1-3 according to some example embodiments.

The transparent conductive film according to Example 1-3 and the ITO film (e.g., a 130 nm-thick ITO film as a comparative example) are respectively mounted in a bending machine (Film Bending System ST-0810-3S, ScienceTwon), 100000 times repetitively bent (radius (R) of curvature: 4 mm), and then, measured with respect to sheet resistance by using Keithley 4200A-SCS (Keithley Instruments, LLC), and the results are shown in FIG. 21. FIG. 21 is a graph showing changes in sheet resistance of the transparent conductive film of Example 1-3 and the ITO film according to the number of repeated bending (radius (R) of curvature: 4 mm).

Figure 22:
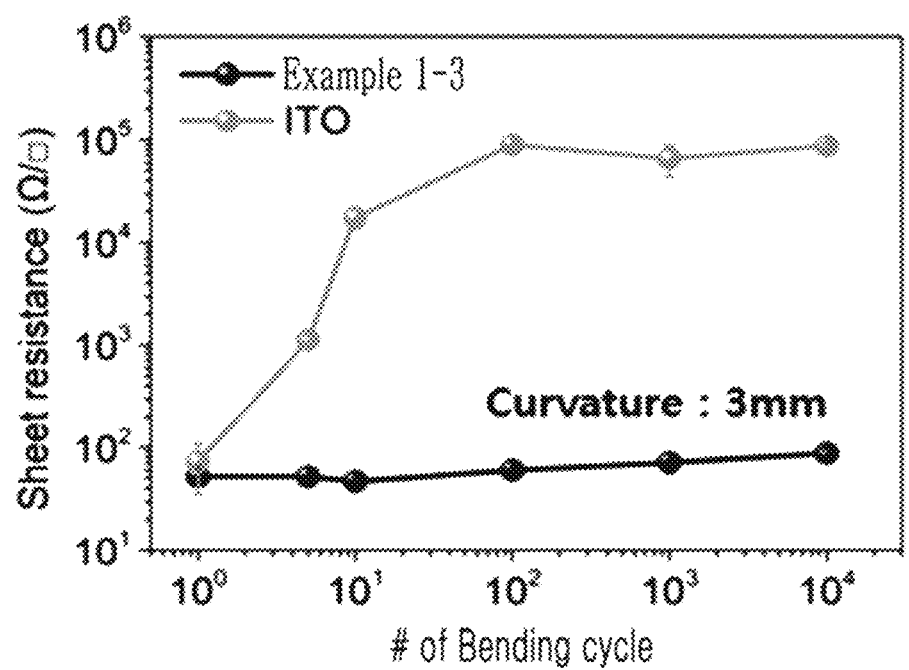
FIG. 22 is a graph showing the change in sheet resistance according to the number of repeated bending (radius of curvature (R): 3 mm) of the transparent conductive film and the ITO film according to Example 1-3 according to some example embodiments.

The transparent conductive film of Example 1-3 and ITO film (e.g., a 130 nm-thick ITO film as a comparative example) are respectively mounted in a bending machine (Film Bending System (ST-0810-3S, ScienceTown), 50000 times repetitively bent (radius (R) of curvature: 3 mm), and measured with respect to sheet resistance by using Keithley 4200A-SCS (Keithley Instruments LLC.), and the results are shown in FIG. 22. FIG. 22 is a graph showing the change in sheet resistance according to the number of repeated bending (radius (R) of curvature: 3 mm) of the transparent conductive film according to Example 1-3 and the ITO film.

Referring to FIGS. 21 and 22, the transparent conductive film of Example 1-3 exhibits almost no changes in sheet resistance after the repeated bending times, but the ITO film exhibits significantly increased sheet resistance according to the repeated bending times.

Evaluation 7: Electrical Characteristics of Transparent Conductive Film

The transparent conductive films of Examples 1-2 and 1-3 and CuS films (5 nm, 10 nm) are measured with respect to conductivity and carrier density by using a hall measurement analysis equipment (HMS-5300, ECOPIA), and the results are shown in Table 2.

TABLE 2

| | Example 1-2 | CuS film (5 nm) | Example 1-3 | CuS film (10 nm) |
|---|---|---|---|---|
| Conductivity (S/cm) | $4.75 \times 10^3$ | $8.19 \times 10^2$ | $3.29 \times 10^3$ | $2.80 \times 10^2$ |
| Carrier density cm$^{-3}$ | $2.49 \times 10^{23}$ | $1.25 \times 10^{22}$ | $1.45 \times 10^{21}$ | $7.91 \times 10^{20}$ |

Referring to Table 2, the transparent conductive films according to Examples 1-2 and 1-3 have superior conductivity and carrier density, compared to the CuS films.

Evaluation 8: Confirmation of Doping of Thin Film Transistor

Figure 23:
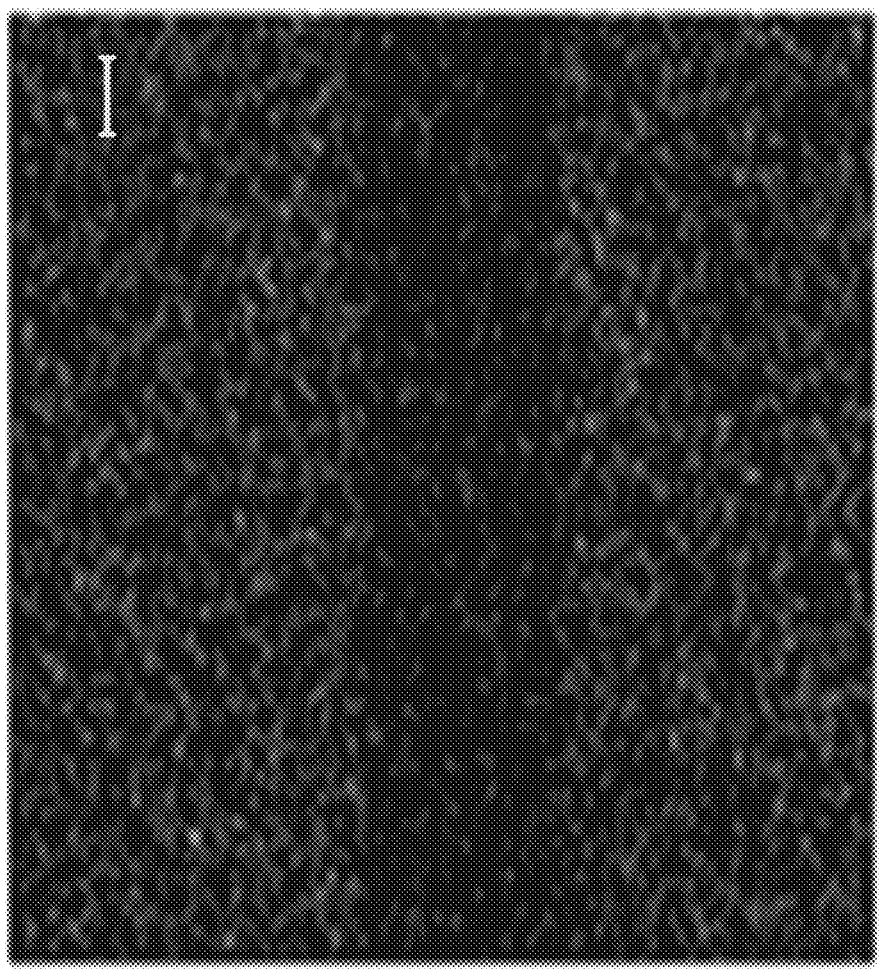
FIG. 23 is a view showing the iodine element analysis result of the thin film transistor according to Example 2-1 using SEM-EDS (Scanning Electron Microscopy/Energy Dispersive X-Ray Spectroscopy) according to some example embodiments.

The thin film transistor of Example 2-1 is analyzed with respect to an iodine element by using SEM-EDS (Scanning Electron Microscopy/Energy Dispersive X-Ray Spectroscopy), and the results are shown in FIG. 23. FIG. 23 is an image that shows the iodine element analysis result of the thin film transistor of Example 2-1 by using SEM-EDS (Scanning Electron Microscopy/Energy Dispersive X-Ray Spectroscopy). Referring to FIG. 23, the iodine element is doped on the source electrode and the drain electrode and a channel between the source and drain electrodes. Accordingly, CuS and $MoS_2$ are simultaneously doped with iodine.

Evaluation 9: Electrical Characteristics of Thin Film Transistor

The thin film transistors according to Examples 2-1 and 2-2 and Comparative Example 2-1 are measured with respect to electric characteristics (threshold voltage, on/off current, and subthreshold swing) by using an I-V curve-measuring equipment (FET characteristic-measuring equipment (4200A-SCS, Keithley Instrument LLC). The results are shown in Table 3.

TABLE 3

| | Comparative Example 2-1 | Example 2-1 | Example 2-2 |
|---|---|---|---|
| Threshold voltage ($V_{th}$) (V) | −3.8 | −2.8 | −2 |
| On/off current (A) | $3 \times 10^{-5} / 6.4 \times 10^{-12}$ | $5 \times 10^{-6} / 6.9 \times 10^{-14}$ | $1.4 \times 10^{-6} / 2.5 \times 10^{-14}$ |
| Subthreshold swing (mV) | 160 | 100 | 80 |

Referring to Table 3, the thin film transistors of Examples 2-1 and 2-2 exhibit an increase in the threshold voltage and the on/off current but a decrease in the subthreshold swing, compared with the thin film transistor according to Comparative Example 2-1. The decrease in subthreshold swing means a decrease in defects and trap density. Accordingly, the thin film transistors of Examples 2-1 and 2-2 exhibit improved electric characteristics, compared with the thin film transistor according to Comparative Example 2-1.

While this inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

DESCRIPTION OF SYMBOLS

10: transistor
13: gate electrode
15: gate insulation layer
17a: source electrode
17b: drain electrode
19: semiconductor thin film
100, 100a, 100b, 100c: sensor
110: first electrode
120: second electrode
130: photoelectric conversion layer
140, 150: auxiliary layer
11, 200: substrate
220: first photodiode
230: second photodiode
300: image sensor
410, 420, 430: light emitting element
1000: sensor-embedded display panel
2000: electronic device

What is claimed is:

1. A transparent conductive film, comprising
a metal chalcogenide compound doped with a halogen,
wherein the transparent conductive film has a sheet resistance of less than or equal to about 60 ohm/sq. at a temperature of about 20° C. to about 25° C.
2. The transparent conductive film of claim 1, wherein the metal chalcogenide compound is represented by Chemical Formula 1:

$$M_x X_y \qquad \text{[Chemical Formula 1]}$$

wherein, in Chemical Formula 1, M is a transition metal, an alkali metal, an alkaline earth metal, or any combination thereof, X is S, Se, Te, or any combination thereof, and x and y have respective values corresponding to a stoichiometric ratio of M and X.
3. The transparent conductive film of claim 2, wherein in Chemical Formula 1, M is Cu, Fe, Zn, Co, Mo, W, Li, or any combination thereof.
4. The transparent conductive film of claim 1, wherein the halogen is fluorine, chlorine, bromine, iodine, or any combination thereof.
5. The transparent conductive film of claim 1, wherein a content of the halogen in the transparent conductive film is in a range of about 0.30 atomic % to about 0.70 atomic % based on a total number of atoms of the transparent conductive film.
6. The transparent conductive film of claim 1, wherein the transparent conductive film is configured to exhibit a light transmittance of incident light of greater than or equal to about 80% in a wavelength region of about 550 nm or more.
7. The transparent conductive film of claim 1, wherein the transparent conductive film is configured to exhibit a sheet resistance increase rate of less than or equal to about 20% after 10000 repetitions of bending with a radius of curvature of 4 mm or less.
8. The transparent conductive film of claim 1, wherein A carrier density of the transparent conductive film is greater than or equal to about $1.0 \times 10^{21}$ cm$^{-3}$.
9. The transparent conductive film of claim 1, wherein a work function of the metal chalcogenide compound doped with the halogen of the transparent conductive film is greater than or equal to about 5.2 eV.
10. The transparent conductive film of claim 1, wherein the transparent conductive film does not include any organic material.
11. A method of manufacturing a transparent conductive film, the method comprising:
exposing a metal film to a chalcogen element-containing material to prepare a film including a metal chalcogenide compound; and
exposing the film including the metal chalcogenide compound to a halogen element-containing material to produce a transparent conductive film including a metal chalcogenide compound doped with a halogen of claim 1.
12. The method of claim 11, wherein
the exposing the metal film to the chalcogen element-containing material exposes the metal film to the chalcogen element-containing material for about 10 seconds to about 50 seconds.
13. The method of claim 11, wherein
the exposing the film including the metal chalcogenide compound to the halogen element-containing material exposes the film including the metal chalcogenide compound to the halogen element-containing material for about 10 seconds to about 50 seconds.
14. The method of claim 11, further comprising:
heat-treating the transparent conductive film including the metal chalcogenide compound doped with the halogen.
15. The method of claim 14, wherein
the heat-treating is performed at about 250° C. or less.
16. A thin film transistor comprising the transparent conductive film of claim 1.
17. The thin film transistor of claim 16, wherein
the thin film transistor includes a semiconductor thin film, a gate electrode at least partially overlapped with the semiconductor thin film, and a source electrode and a drain electrode electrically connected to the semiconductor thin film, and the source electrode and the drain electrode include the transparent conductive film.

18. A device comprising the transparent conductive film of claim 1.

19. A transparent conductive film, comprising:

a metal chalcogenide compound doped with a halogen, wherein the metal chalcogenide compound is represented by Chemical Formula 1:

$$M_xX_y \quad \text{[Chemical Formula 1]}$$

wherein, in Chemical Formula 1,
- M is a transition metal, an alkali metal, an alkaline earth metal, or any combination thereof,
- X is S, Se, Te, or any combination thereof, and
- x and y have respective values corresponding to a stoichiometric ratio of M and X, wherein a content of the halogen in the transparent conductive film is in a range of about 0.30 atomic % to about 0.70 atomic % based on a total number of atoms of the transparent conductive film.

20. A thin film transistor, comprising:

a semiconductor thin film, a gate electrode at least partially overlapped with the semiconductor thin film, and a source electrode and a drain electrode electrically connected to the semiconductor thin film, wherein the source electrode and the drain electrode include a first metal chalcogenide compound, wherein the semiconductor thin film includes a second metal chalcogenide compound, and wherein the first metal chalcogenide compound and the second metal chalcogenide compound are doped with a halogen.

* * * * *